(12) United States Patent
Cho et al.

(10) Patent No.: US 12,713,589 B2
(45) Date of Patent: Aug. 18, 2026

(54) SEMICONDUCTOR MEMORY DEVICES

(71) Applicant: Samsung Electronics Co., Ltd., Suwon-si (KR)

(72) Inventors: Seongtak Cho, Suwon-si (KR); Inwoo Kim, Suwon-si (KR); Miso Myung, Suwon-si (KR); Jihun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 411 days.

(21) Appl. No.: 18/470,537

(22) Filed: Sep. 20, 2023

(65) Prior Publication Data

US 2024/0324182 A1 Sep. 26, 2024

(30) Foreign Application Priority Data

Mar. 24, 2023 (KR) ........................ 10-2023-0038633

(51) Int. Cl.
*H10B 12/00* (2023.01)

(52) U.S. Cl.
CPC ....... *H10B 12/482* (2023.02); *H10B 12/0335* (2023.02); *H10B 12/315* (2023.02)

(58) Field of Classification Search
CPC ......................... H10B 12/482; H10B 12/0335; H10B 12/315; H10B 12/033; H10B 12/485
See application file for complete search history.

(56) References Cited

U.S. PATENT DOCUMENTS

| | | | | |
|---|---|---|---|---|
| 9,786,558 B2 | 10/2017 | Kim et al. | | |
| 10,008,505 B2 | 6/2018 | Lee et al. | | |
| 10,211,091 B2 | 2/2019 | Lee et al. | | |
| 11,121,134 B2 | 9/2021 | Lee et al. | | |
| 11,205,652 B2 | 12/2021 | Lee et al. | | |
| 2005/0218440 A1* | 10/2005 | Park | H10B 12/485 | 257/E27.088 |
| 2007/0241380 A1* | 10/2007 | Hasunuma | H10B 12/0335 | 257/296 |
| 2010/0295134 A1* | 11/2010 | Nagashima | H10B 41/35 | 257/E27.098 |

(Continued)

FOREIGN PATENT DOCUMENTS

| | | |
|---|---|---|
| CN | 112447604 A | 3/2021 |
| CN | 115116969 A | 9/2022 |
| CN | 115274663 A | 11/2022 |

*Primary Examiner* — Mohsen Ahmadi
(74) *Attorney, Agent, or Firm* — Wolf, Greenfield & Sacks, P.C.

(57) ABSTRACT

A semiconductor device includes a substrate that includes an active pattern, a bit line structure that crosses the active pattern, a storage node contact electrically connected to the active pattern next to the bit line structure, a spacer structure between a side surface of the bit line structure and the storage node contact, an upper surface of the spacer structure is at a vertical level lower than an upper surface of the bit line structure, an insulating pattern on the spacer structure, and a landing pad structure electrically connected to the storage node contact and on the spacer structure and the bit line structure. The landing pad structure include a first side surface in contact with the spacer structure, a second side surface in contact with the bit line structure, and a third side surface in contact with the insulating pattern.

20 Claims, 26 Drawing Sheets

(56) References Cited

U.S. PATENT DOCUMENTS

| | | | | |
|---|---|---|---|---|
| 2013/0256769 | A1* | 10/2013 | Jeong | H10B 12/31 257/296 |
| 2016/0276349 | A1* | 9/2016 | Kwon | H10B 12/053 |
| 2016/0308008 | A1* | 10/2016 | Yeo | H10D 30/024 |
| 2017/0125283 | A1* | 5/2017 | Lee | H10B 12/34 |
| 2017/0317079 | A1* | 11/2017 | Kim | H10D 84/834 |
| 2020/0105625 | A1* | 4/2020 | Yoo | H10D 84/0188 |
| 2020/0194439 | A1* | 6/2020 | Kim | H10B 12/482 |
| 2021/0296321 | A1* | 9/2021 | Heo | H10B 12/053 |
| 2022/0139921 | A1 | 5/2022 | Kim et al. | |
| 2023/0112907 | A1* | 4/2023 | Kim | H10B 12/0335 257/296 |
| 2023/0371235 | A1* | 11/2023 | Ahn | H10B 12/485 |
| 2024/0244832 | A1* | 7/2024 | Lee | H10B 12/315 |
| 2024/0251549 | A1* | 7/2024 | Ko | H10B 12/315 |

* cited by examiner

DSP
LP
DP
137
132
131
130
BL
5
7
110
105
107
WL
102
100
B'
B
DC
ACT
SS1
LS
SP1
BP
OSP1
21
22
23
141
A'
BC
112b
112a
LS1
LS2
LS3
BPa
BLS
TR
A

DSP
LP
DP
137
132
131
130
BL
5
7
110
105
107
WL
102
100
B'
B
DC
ACT
LS
SP2
BP
21
22
23
141
A'
A
BC
112a
112b
LS1
LS2
LS3
TR
BLS 137
132
131
130
BL
5
7
110
105
107
WL
102
100
DC
ACT
112a
112b
TR
A
A'
B
B'

137
132
131
130
BL
5
7
110
105
107
WL
102
100
B'
B
DC
ACT
141
A'
112b
112a
21a
22a
23a
BLS
TR
A 137
132
131
130
BL
5
7
110
105
107
WL
102
100
B'
B
DC
ACT
0SPa
21
22
23
SP
141
A'
A
BC
112b
112a
TR
BLS

137
132
131
130
BL
5
7
110
105
107
WL
102
100
B'
B
DC
ACT
21
22
23
SP1
141
A'
A
BC
112b
112a
BP1
TR
BLS

SEMICONDUCTOR MEMORY DEVICES

CROSS-REFERENCE TO RELATED APPLICATION(S)

This U.S. non-provisional patent application claims priority under 35 U.S.C. § 119 to Korean Patent Application No. 10-2023-0038633, filed on Mar. 24, 2023, in the Korean Intellectual Property Office, the entire contents of which are hereby incorporated by reference.

BACKGROUND

The present disclosure relates to semiconductor memory devices, and more particularly, relates to semiconductor memory devices including a landing pad and a spacer.

Due to their relatively small-size, multi-functionality, and/or relatively low-cost characteristics, semiconductor devices are considered important elements in the electronic industry. The semiconductor devices may be classified into a memory device for storing data, a logic device for processing data, and a hybrid device including both memory and logic elements.

Recently, with the high-speed and low-power consumption of electronic devices, semiconductor devices embedded in the electronic devices also require high operating speeds and/or low operating voltages, and more highly integrated semiconductor devices are required to meet these requirements. However, as integration of semiconductor devices intensifies, electrical characteristics and production yield of the semiconductor devices may decrease. Accordingly, many studies are being conducted to improve the electrical characteristics and production yield of semiconductor devices.

SUMMARY

An object of the present disclosure is to provide semiconductor memory devices with improved reliability.

The problem to be solved by the present disclosure is not limited to the problems mentioned above, and other problems not mentioned will be clearly understood by those skilled in the art from the description below.

A semiconductor memory device according to some embodiments of the present disclosure may include a substrate that includes an active pattern, a bit line structure that crosses the active pattern, a storage node contact electrically connected to the active pattern next to the bit line structure, a spacer structure between a side surface of the bit line structure and the storage node contact, wherein an upper surface of the spacer structure is at a vertical level lower than an upper surface of the bit line structure with a lower surface of the substrate providing a base reference plane, an insulating pattern on the spacer structure, and a landing pad structure electrically connected to the storage node contact and on the spacer structure and the bit line structure. The landing pad structure may include a first side surface in contact with the spacer structure, a second side surface in contact with the bit line structure, and a third side surface in contact with the insulating pattern.

A semiconductor device according to some embodiments of the present disclosure may include a substrate that includes an active pattern, the active pattern including a first source/drain region and a second source/drain region spaced apart from each other, a bit line structure that is electrically connected to the first source/drain region and crosses the active pattern, a storage node contact electrically connected to the second source/drain region, a spacer structure on a side of the bit line structure, wherein an upper surface of the spacer structure is at a lower vertical level than an upper surface of the bit line structure with a lower surface of the substrate providing a base reference plane, a landing pad structure electrically connected to the storage node contact, and an insulating pattern on the spacer structure and adjacent to the landing pad structure. The spacer structure may include a first spacer between the bit line structure and the storage node contact and a second spacer on an upper surface of the first spacer, and between the bit line structure and the landing pad structure. The first spacer may be a multilayer spacer, and the second spacer may be a single-layer spacer.

A semiconductor memory device according to some embodiments of the present disclosure may include a substrate that includes an active pattern, the active pattern including a first source/drain region and a pair of second source/drain regions spaced apart from each other with the first source/drain region therebetween, a device isolation layer on the substrate and in a trench that defines the active pattern, a word line extending in a first direction that crosses the active pattern, wherein the word line is between the first and second source/drain regions, a gate dielectric layer between the word line and the active pattern, a word line capping pattern on the word line, an interlayer insulating pattern on the word line capping pattern, a bit line structure electrically connected to the first source/drain region and extending in a second direction that intersects the first direction, wherein the bit line structure crosses the active pattern and is on the interlayer insulating pattern, a spacer structure on a side surface of the bit line structure, wherein an upper surface of the spacer structure is at a lower vertical level than an upper surface of the bit line structure with a lower surface of the substrate providing a base reference plane, a storage node contact electrically connected to at least one of the second source/drain regions, wherein the storage node contact is spaced apart from the bit line structure with the spacer structure therebetween, a landing pad structure electrically connected to the storage node contact, an insulating pattern on the spacer structure, and a data storage pattern on the landing pad structure. The landing pad structure may have a stepped shape in a cross-sectional view, and the spacer structure may include a multilayer spacer on the interlayer insulating pattern and a single-layer spacer on the multilayer spacer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 7B, 8B, 9B, 10B, 11B, 12B, 13B, and 14B are cross-sectional views taken along lines A-A' and B-B' of FIGS. 7A, 8A, 9A, 10A, 11A, 12A, 13A, and 14A, respectively.

FIGS. 15 and 16 are cross-sectional views taken along lines A-A' and B-B' of FIG. 14A.

DETAILED DESCRIPTION

Figure 1:
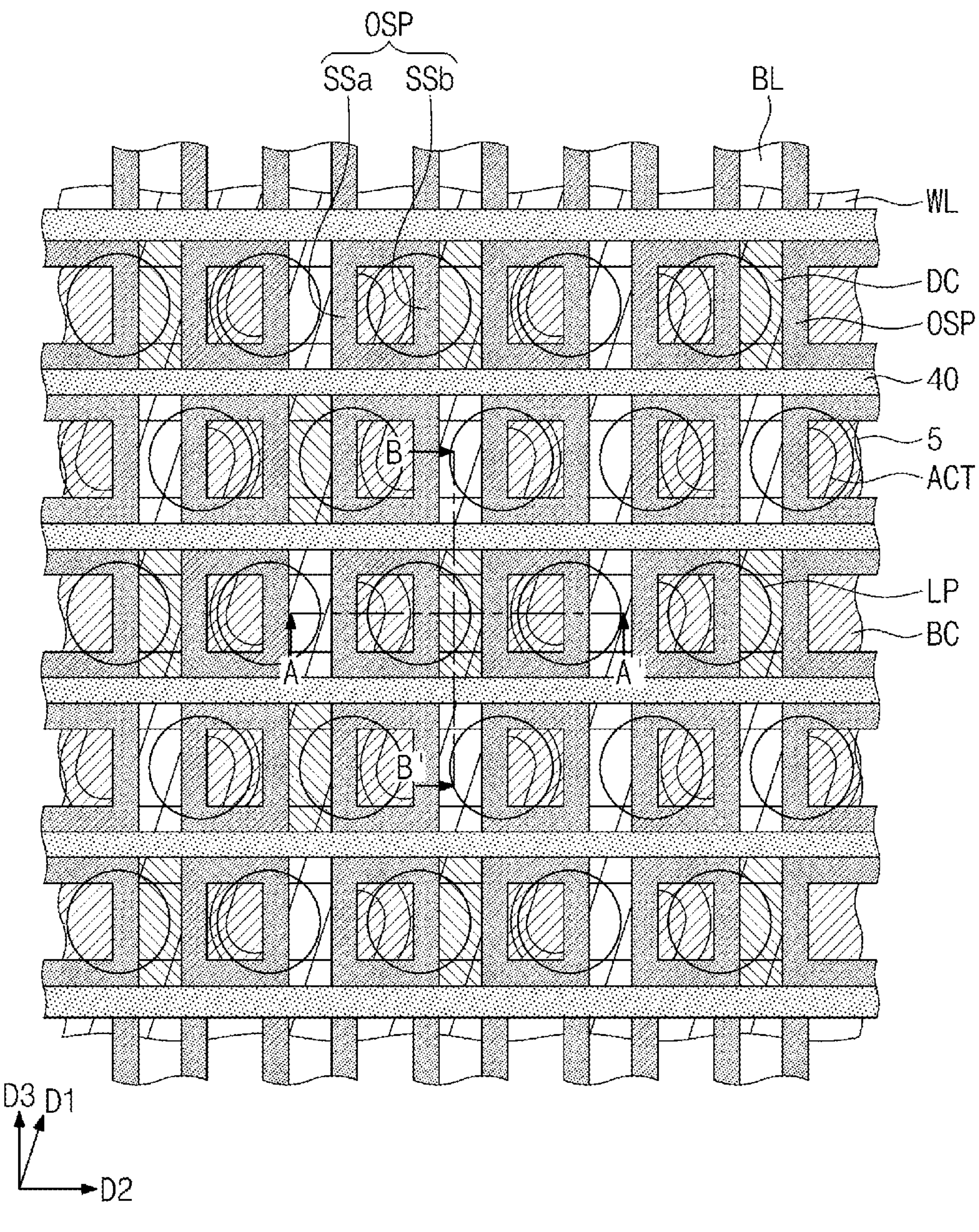
FIG. 1 is a plan view of a semiconductor memory device according to some embodiments of the present disclosure.

FIG. 1 is a plan view of a semiconductor memory device according to some embodiments of the present disclosure.

Figure 2:
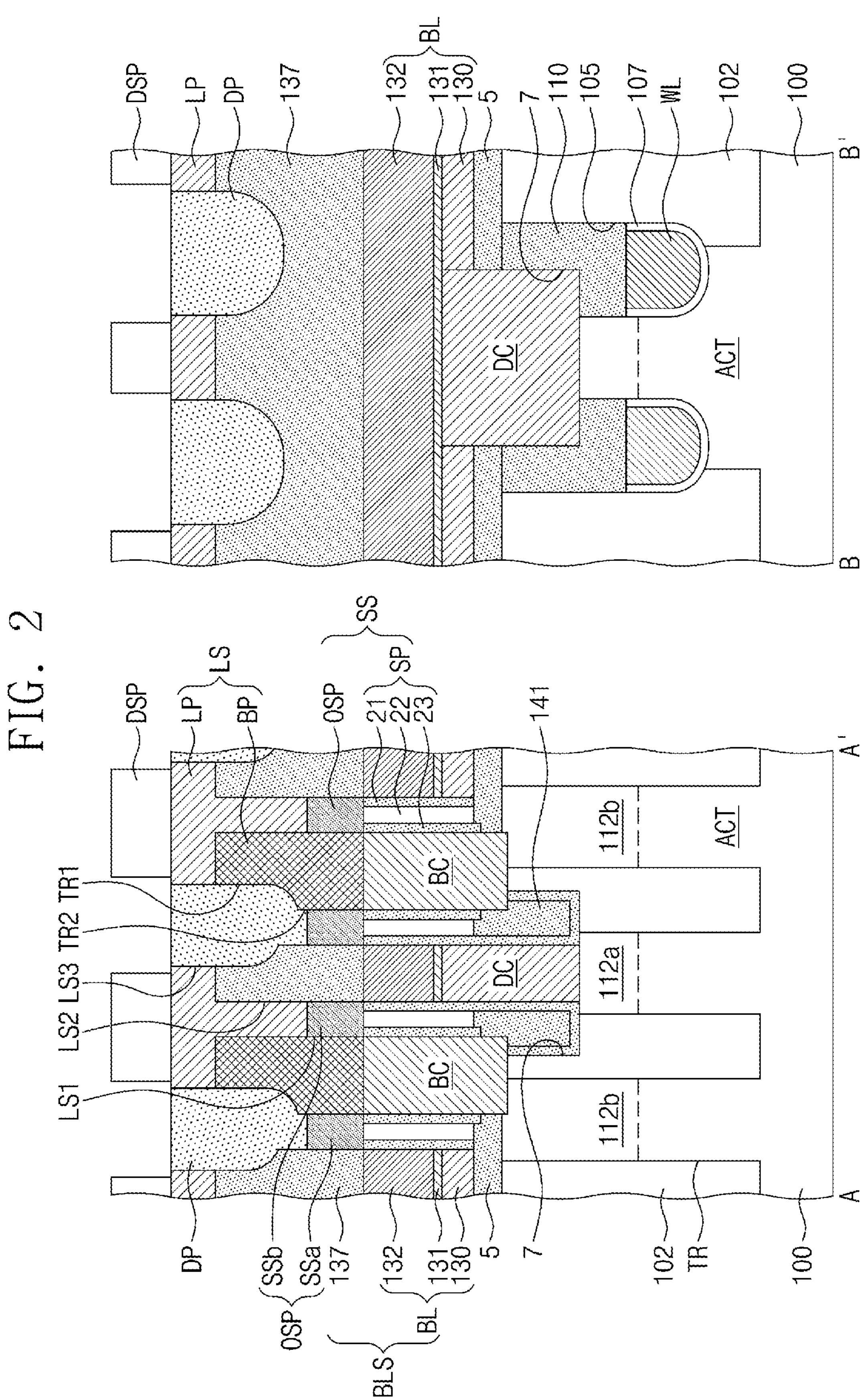
FIGS. 2, 3, and 4 are cross-sectional views taken along lines A-A' and B-B' of FIG. 1.

FIG. 2 is a cross-sectional view taken along lines A-A' and B-B' of FIG. 1.

Referring to FIGS. 1 and 2, device isolation layers 102 defining active patterns ACT may be provided on a substrate 100. For example, the substrate 100 may be a semiconductor substrate including silicon, germanium, or silicon-germanium. The device isolation layer 102 may be formed in trenches TR on the substrate 100. The device isolation layer 102 may include silicon oxide.

The active patterns ACT may be formed by patterning an upper portion of the substrate 100. Each of the active patterns ACT may have a bar shape that is elongated (e.g., extends longitudinally) in a first direction D1 when viewed in a plan view. That is, each of the active patterns ACT may have a long axis in the first direction D1. The active patterns ACT may be arranged parallel to each other in the first direction D1, and an end of one active pattern ACT may be arranged adjacent to a center of another active pattern ACT adjacent thereto.

Word lines WL may cross the active patterns ACT. As used herein, "an element A crosses an element B" (or similar language) may mean that there is at least one line that extends in a vertical direction and intersects both the elements A and B. The word lines WL may be disposed in recess regions 105 formed in the device isolation layer 102 and the active patterns ACT. The word lines WL may be parallel to a second direction D2 crossing the first direction D1. Bottom surfaces of the word lines WL may be curved or rounded. The word lines WL may include a conductive material. A gate dielectric layer 107 may be disposed between the word lines WL and the recess region 105. A bottom of the recess region 105 may be relatively deep within the device isolation layer 102 and relatively shallow within the active patterns ACT. The gate dielectric layer 107 may include at least one of silicon oxide, silicon nitride, silicon oxynitride, or a high dielectric material.

A first source/drain region 112*a* may be disposed in the active patterns ACT between a pair of word lines WL, and a pair of second source/drain regions 112*b* may be disposed in both edge regions of the active patterns ACT, respectively. For example, the first and second source/drain regions 112*a* and 112*b* may be doped with n-type impurities. The first source/drain region 112*a* may correspond to the common drain region, and the second source/drain regions 112*b* may correspond to the source region. The word lines WL and the first and second source/drain regions 112*a* and 112*b* adjacent thereto may constitute transistors. The word lines WL may be disposed in the recess region 105, and thus a channel length of the channel region under the word lines WL may be increased within a limited plane area. Therefore, short-channel effect and the like may be minimized.

Upper surfaces of the word lines WL may be lower than upper surfaces of the active patterns ACT. For example, upper surfaces of the word lines WL may be lower than upper surfaces of the active patterns ACT with a lower surface of the substrate 100 providing a base reference plane. A word line capping pattern 110 may be disposed on each of the word lines WL. The word line capping patterns 110 may have a line shape extending in a length direction of the word lines WL, and may cover the entire upper surfaces of the word lines WL. The word line capping patterns 110 may fill an area above the word lines WL in the recess region 105. The word line capping pattern 110 may include, for example, silicon nitride.

An interlayer insulating pattern 5 may be disposed on the substrate 100. The interlayer insulating pattern 5 may include a single layer or multiple layers including at least one of silicon oxide, silicon nitride, or silicon oxynitride. The interlayer insulating patterns 5 may be formed in a shape of islands (e.g., a round shape) spaced apart from each other when viewed in a plan view. The interlayer insulating pattern 5 may simultaneously cover end portions of two adjacent active patterns ACT.

Upper portions of the substrate 100, device isolation layer 102, and word line capping pattern 110 may be partially recessed to form a wiring-contact opening 7. The wiring-contact opening 7 may have a mesh shape when viewed in a plan view. A sidewall of the wiring-contact opening 7 may be vertically aligned with a sidewall of the interlayer insulating pattern 5. The wiring-contact opening 7 may expose a portion of the first source/drain region 112*a*.

A bit line structure BLS may be provided on the interlayer insulating pattern 5. The bit line structure BLS may include bit lines BL and a bit line capping pattern 137. The bit lines BL may be disposed on an upper surface of the interlayer insulating pattern 5. The bit lines BL may cross the word line capping patterns 110 and the word lines WL. The bit lines BL may be parallel to a third direction D3 crossing the first and second directions D1 and D2. The bit lines BL may include a bit line polysilicon pattern 130, a bit line diffusion barrier pattern 131, and a bit line metal pattern 132 sequentially stacked. The bit line polysilicon pattern 130 may include polysilicon doped or undoped with impurities. The bit line diffusion barrier pattern 131 may include metal nitride. The bit line metal pattern 132 may include, for example, tungsten, titanium, and/or tantalum. The bit line capping pattern 137 may be disposed on the bit lines BL. The bit line capping patterns 137 may include an insulating material. For example, the bit line capping pattern 137 may include a nitride (e.g., silicon nitride) and/or an oxynitride (e.g., silicon oxynitride).

Bit line contacts DC may be disposed in the wiring-contact opening 7 crossing the bit lines BL. The bit line contacts DC may include polysilicon doped or undoped with impurities. A portion of a side surface of the bit line contact DC may be in contact with a side wall of the interlayer insulating pattern 5. The bit line contact DC may electrically connect the first source/drain region 112*a* and the bit lines BL.

A lower buried insulating pattern 141 may be disposed in the wiring-contact opening 7 where the bit line contact DC is not disposed. The lower buried insulating pattern 141 may include a single layer or multiple layers including at least one of silicon oxide, silicon nitride, or silicon oxynitride.

Storage node contacts BC may be disposed between a pair of adjacent bit lines BL. The storage node contacts BC may be spaced apart from each other. The storage node contacts BC may include polysilicon doped or undoped with impurities. The storage node contact BC may be electrically connected to the second source/drain region 112*b*. For example, the storage node contact BC may be electrically connected to the second source/drain region 112_b_ next to the bit line structure BLS. The storage node contact BC may be next to the bit line structure BLS with a first spacer SP which will be described later therebetween.

An insulation fence 40 may be disposed between the bit lines BL and between the storage node contacts BC. The insulation fence 40 may include, for example, an insulation material such as silicon nitride, silicon oxide, or silicon oxynitride. The storage node contacts BC and the insulation fence 40 may be alternately disposed on one side of the bit line BL along the bit line BL. A height of an upper end of the insulation fence 40 may be higher than a height of an upper end of each of the storage node contacts BC. For example, a height of an upper end of the insulation fence 40 may be higher than a height of an upper end of each of the storage node contacts BC with a lower surface of the substrate 100 providing a base reference plane.

A spacer structure SS may be disposed between the bit line structure BLS and the storage node contact BC. The spacer structure SS may include a first spacer SP and a second spacer OSP. An upper surface of the spacer structure SS may be positioned at a lower vertical level than an upper surface of the bit line structure BLS. As used herein, the term “vertical level” may mean a height in a vertical direction from a lower surface of the substrate 100 (e.g., the lower surface of the substrate 100 provides a base reference plane).

The first spacer SP may be interposed between the bit lines BL and the storage node contact BC. An upper surface of the first spacer SP may be positioned at substantially the same vertical level as an upper surface of the storage node contact BC. The first spacer SP may include a multilayer spacer. For example, the first spacer SP may include a first sub-spacer 21, a second sub-spacer 22, and a third sub-spacer 23. The first sub-spacer 21 may be in contact with a side surface of the bit line BL. The third sub-spacer 23 may be in contact with a side surface of the storage node contact BC. The first sub-spacer 21 and the third sub-spacer 23 may include the same material. For example, the first sub-spacer 21 and the third sub-spacer 23 may include silicon nitride. The first sub-spacer 21 may be spaced apart from the third sub-spacer 23. The second sub-spacer 22 may be interposed between the first sub-spacer 21 and the third sub-spacer 23. The second sub-spacer 22 may include a material different from that of the first sub-spacer 21 and the third sub-spacer 23. For example, the second sub-spacer 22 may include silicon oxide.

The first sub-spacer 21 may extend to cover a side surface of the bit line contact DC and a side wall and bottom of the wiring-contact opening 7. That is, the first sub-spacer 21 may be interposed between the bit line contact DC and the lower buried insulating pattern 141, between the word line capping pattern 110 and the lower buried insulating pattern 141, between the substrate 100 and the lower buried insulating pattern 141, and between the device isolation layer 102 and the lower buried insulating pattern 141.

The second spacer OSP may be disposed on an upper surface of the first spacer SP. The second spacer OSP may be disposed between the bit line structure BLS and a landing pad structure LS, which will be described later. The second spacer OSP may cover a portion of a side surface of the bit line capping pattern 137. The second spacer OSP may be a single-layer spacer. For example, the second spacer OSP may include an oxide (e.g., silicon oxide).

The second spacer OSP may have a closed curve shape when viewed in a plan view, and may be disposed between adjacent bit line structures BLS. In some embodiments, the second spacer OSP may have a quadrilateral shape in a plan view. The second spacer OSP may include a first portion SSa and a second portion SSb that face each other in the second direction D2. The first portion SSa and the second portion SSb may have different heights (e.g., thicknesses) on the first spacer SP.

The second portion SSb of the second spacer OSP may be interposed between an upper surface of the first spacer SP and a lowermost surface of the landing pad LP, which will be described later. The first portion SSa of the second spacer OSP may be interposed between the upper surface of the first spacer SP and a lowermost surface of an insulating pattern DP, which will be described later. Referring to FIG. 2, although an upper surface of the first portion SSa of the second spacer OSP and an upper surface of the second portion SSb of the second spacer OSP are shown to have similar vertical levels, the present disclosure is not limited thereto. In some embodiments, the upper surface of the first portion SSa of the second spacer OSP and the upper surface of the second portion SSb of the second spacer OSP may be positioned at different vertical levels. That is, the first portion SSa of the second spacer OSP may have a first height (refer to H1 in FIG. 16) on the first spacer SP, and the second portion SSb of the second spacer OSP may have a second height (refer to H2 in FIG. 16) different from the first height (refer to H1 in FIG. 16) on the first spacer SP. For example, the second spacer OSP may have a first height between the first spacer SP and the insulating pattern DP which will be described later (e.g., a first height of the first portion SSa), and may have a second height different from the first height between the first spacer SP and a landing pad structure LS which will be described later (e.g., a second height of the second portion SSb).

A landing pad structure LS may be disposed on the storage node contact BC. The landing pad structure LS may be electrically connected to the storage node contact BC. The landing pad structure LS may include a first side surface LS1 in contact with a side surface of the second spacer OSP of the spacer structure SS, a second side surface LS2 in contact with a side surface of the bit line capping pattern 137 of the bit line structure BLS, and a third side surface LS3 in contact with the insulating pattern DP, which will be described later. The first side surface LS1, the second side surface LS2, and the third side surface LS3 of the landing pad structure LS may not be vertically aligned with each other (e.g., may not be coplanar with each other). The first, second and third side surfaces LS1, LS2, and LS3 of the landing pad structure LS may form a stepped shape (e.g., a stepped profile). That is to say, the landing pad structure LS may have a stepped shape in a cross-sectional view.

The landing pad structure LS may include a barrier pattern BP and a landing pad LP. The barrier pattern BP may be disposed between a pair of spacer structures SS on the storage node contact BC. The barrier pattern BP may be directly connected to the storage node contact BC. An upper surface of the barrier pattern BP may be positioned at substantially the same vertical level as an upper surface of the bit line capping pattern 137. The upper surface of the barrier pattern BP may be positioned at a higher vertical level than an upper surface of the spacer structure SS. The barrier pattern BP may include a conductive material. For example, the barrier pattern BP may include titanium nitride. For example, the first side surface LS1 of the landing pad structure LS may correspond to a lower portion of a side surface of the barrier pattern BP.

The landing pad LP may be disposed on the barrier pattern BP. The landing pad LP may include a pad portion disposed on the upper surface of the barrier pattern BP and the upper surface of the bit line capping pattern 137, and a protruding portion protruding or extending toward the substrate 100 from the pad portion. Accordingly, the landing pad LP may have a 'T'-shaped cross section. The pad portion may be arranged in a zigzag or honeycomb shape when viewed in a plan view. A lower surface of the protruding portion may be in direct contact with an upper surface of the second portion SSb of the second spacer OSP. The protruding portion may be vertically aligned with the second portion SSb of the second spacer OSP. For example, opposing side surfaces of the protruding portion may respectively be vertically aligned (e.g., may respectively be coplanar) with opposing side surfaces of the second portion SSb of the second spacer OSP. The protruding portion may be vertically aligned with the spacer structure SS. For example, opposing side surfaces of the protruding portion may respectively be vertically aligned (e.g., may respectively be coplanar) with opposing side surfaces of the spacer structure SS. Accordingly, a width of a lower surface of the protruding portion may be substantially the same (e.g., may be substantially equal) as a width of an upper surface and/or a lower surface of the second portion SSb of the second spacer OSP. The landing pad LP may be formed of a conductive material different from that of the barrier pattern BP. For example, the landing pad LP may include tungsten. For example, the second side surface LS2 of the landing pad structure LS may correspond to a side surface of the protruding portion of the landing pad LP, and the third side surface LS3 of the landing pad structure LS may correspond to a side surface of the pad portion of the landing pad LP.

A first trench TR1 and a second trench TR2 may be formed on the landing pad structure LS and the bit line capping pattern 137. The second trench TR2 may be formed on an upper surface of the first portion SSa of the second spacer OSP. The first trench TR1 may be connected to the second trench TR2 on the second trench TR2. The first trench TR1 may have a greater width than that of the second trench TR2. A width of the second trench TR2 may be substantially the same as that of the first portion SSa of the second spacer OSP.

An insulating pattern DP may be provided in the first trench TR1 and the second trench TR2 on the first portion SSa of the second spacer OSP. The insulating pattern DP may pass through the landing pad LP and extend to the upper surface of the first portion SSa of the second spacer OSP. The landing pads LP may be separated from each other in the second and third directions D2 and D3 by the insulating pattern DP. The insulating pattern DP may include a protruding portion provided in the second trench TR2. The protruding portion of the insulating pattern DP may be vertically aligned with the second spacer OSP. A width of a lower surface of the insulating pattern DP may be substantially the same as that of an upper surface of the second spacer OSP. For example, opposing side surfaces of the protruding portion of the insulating pattern DP may respectively be vertically aligned (e.g., may respectively be coplanar) with opposing side surfaces of the first portion SSa of the second spacer OSP, and a width of a lower surface of the insulating pattern DP may be substantially the same as that of an upper surface of the first portion Ssa of the second spacer OSP. The insulating pattern DP may include an insulating material such as silicon nitride. The insulating pattern DP may be on the spacer structure SS.

A data storage pattern DSP may be disposed on the landing pad LP. The data storage pattern DSP may be a capacitor including a lower electrode, a dielectric layer, and an upper electrode. As another example, the data storage pattern DSP may be a phase change material pattern, a variable resistance material pattern, or a magnetic tunnel junction pattern.

According to some embodiments of the present disclosure, the landing pad LP of the semiconductor memory device may include a pad portion on an upper surface of the bit line capping pattern 137 and an upper surface of the barrier pattern BP, and a protruding portion extending from the pad portion onto an upper surface of one spacer structure SS. An area between the pad portion of the landing pad LP and the storage node contact BC may be increased due to the protruding portion of the landing pad LP. That is, a contact margin of the pad portion of the landing pad LP may be improved. Thus, a semiconductor memory device with improved reliability may be provided. In addition, even when a width of the first spacer SP is formed thick or wider to increase a width of the insulating pattern DP separating the landing pads LP, the contact margin of the pad portion may not be affected due to the protruding portion of the landing pad LP.

Figure 3:
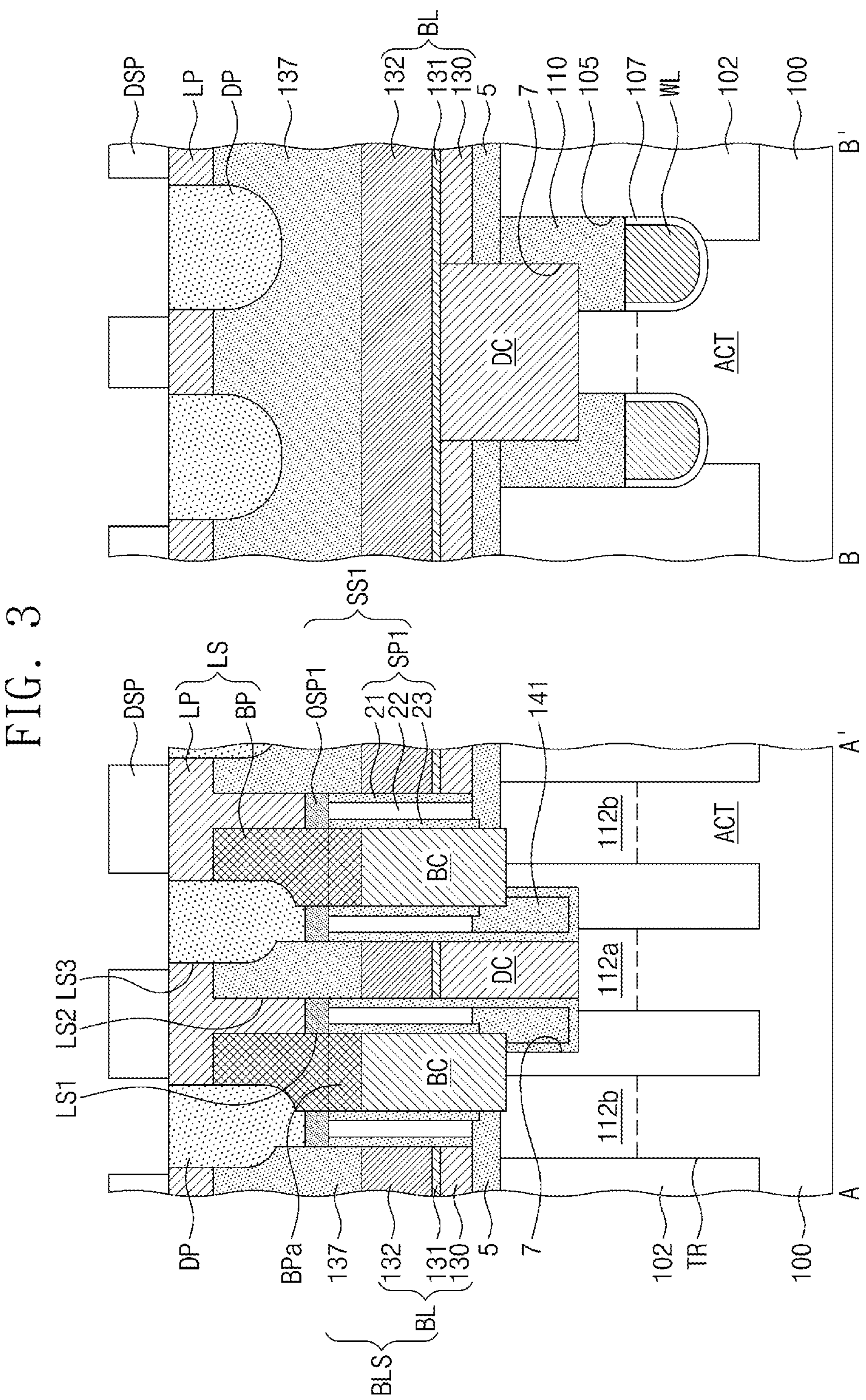

FIG. 3 is a cross-sectional view of a semiconductor memory device according to some embodiments taken along lines A-A' and B-B' of FIG. 1.

Referring to FIG. 3, a semiconductor memory device may include a spacer structure SS1 different from the spacer structure SS of FIG. 2.

The spacer structure SS1 may include a first spacer SP1 and a second spacer OSP1 on an upper surface of the first spacer SP1. An upper surface of the first spacer SP1 may be positioned at a higher vertical level than an upper surface of the storage node contact BC. Accordingly, the first spacer SP1 may be in contact with a portion of the side surface of the barrier pattern BP and a portion of the side surface of the bit line capping pattern 137.

The barrier pattern BP may include a barrier layer Bpa. The barrier layer Bpa may be a portion of the barrier pattern BP positioned between the adjacent first spacers SP1 on the upper surface of the storage node contact BC. A boundary of the barrier layer Bpa may not be visible within the barrier pattern BP.

A first side surface LS1 of the landing pad structure LS may be in contact with a portion of the side surface of the first spacer SP1 and the side surface of the second spacer OSP1. More specifically, the side surface of the first spacer SP1 may be in contact with the side surface of the barrier layer Bpa. Other components may be substantially the same as those described with reference to FIG. 2.

Figure 4:
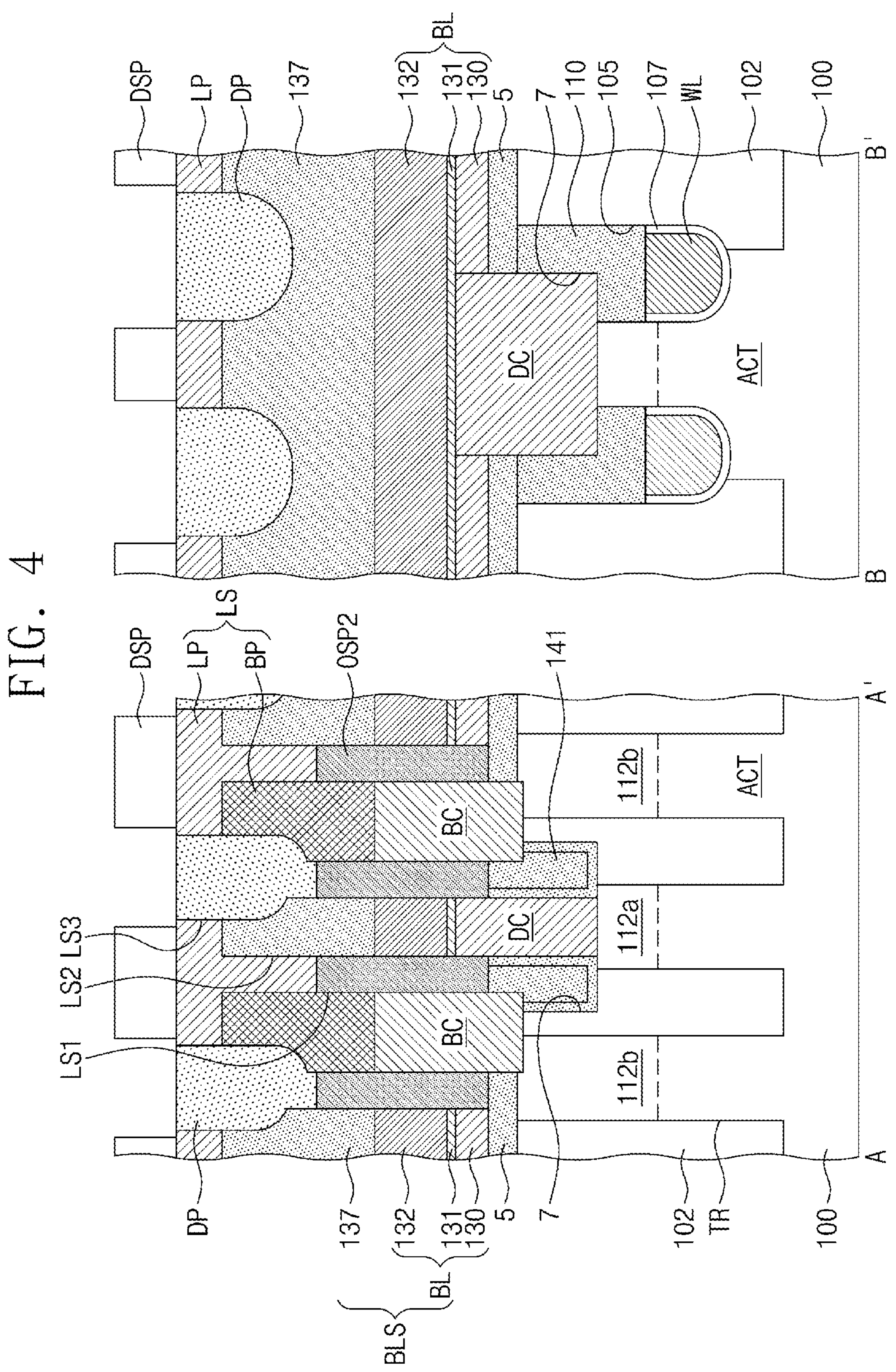

FIG. 4 is a cross-sectional view of a semiconductor memory device according to some embodiments of the present disclosure taken along lines A-A' and B-B' of FIG. 1.

Referring to FIG. 4, a semiconductor memory device may include a spacer structure OSP2 different from the spacer structure SS of FIG. 2.

The spacer structure OSP2 may include a single-layer spacer. The spacer structure OSP2 may be a single layer extending from the upper surface of the interlayer insulating pattern 5 to a lowermost surface of the insulating pattern DP or a lowermost surface of the landing pad LP. The spacer structure OSP2 may include, for example, silicon oxide. Other components may be substantially the same as those described with reference to FIG. 2.

Figure 5:
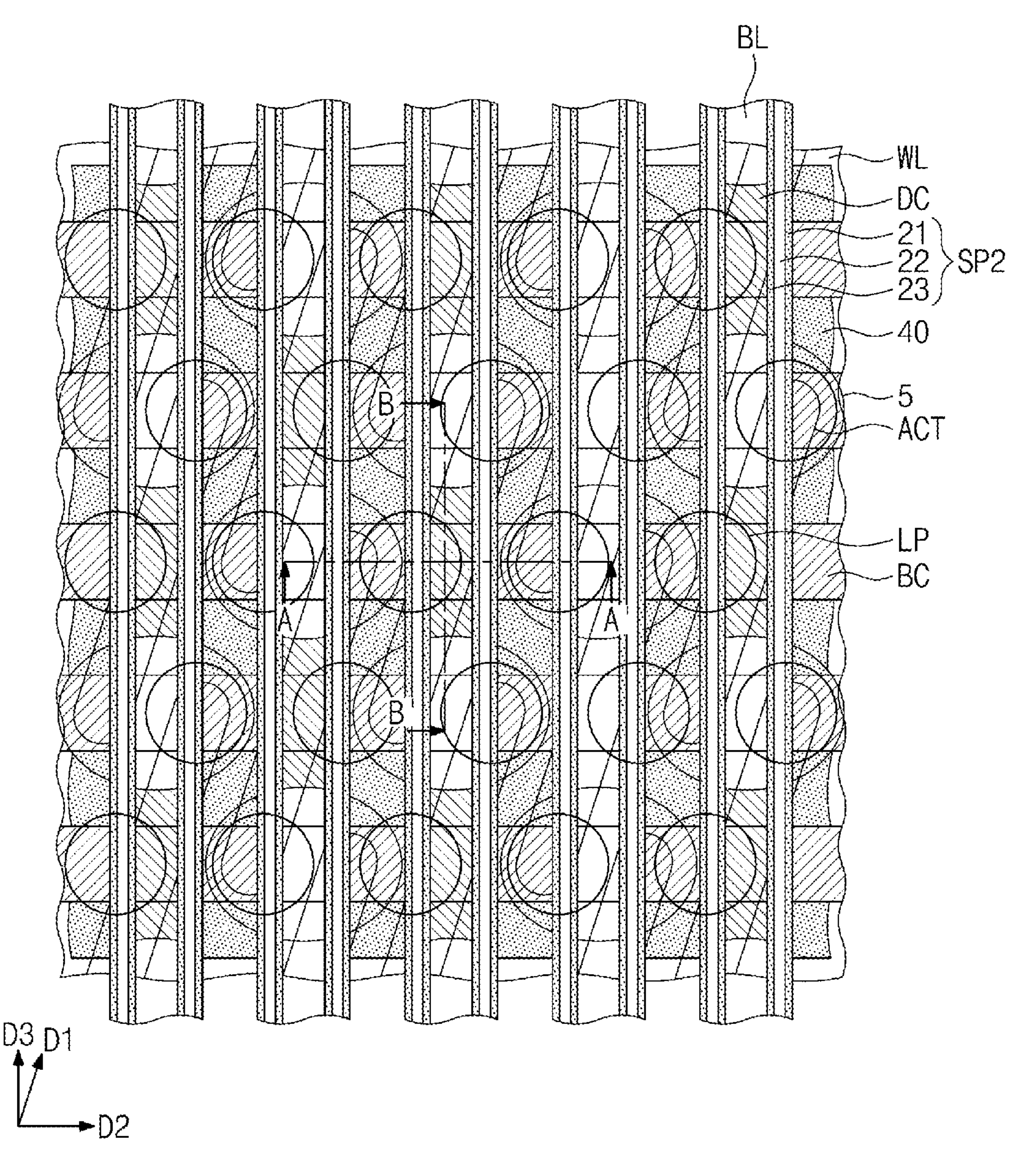
FIG. 5 is a plan view of a semiconductor memory device according to some embodiments of the present disclosure.
Figure 6:
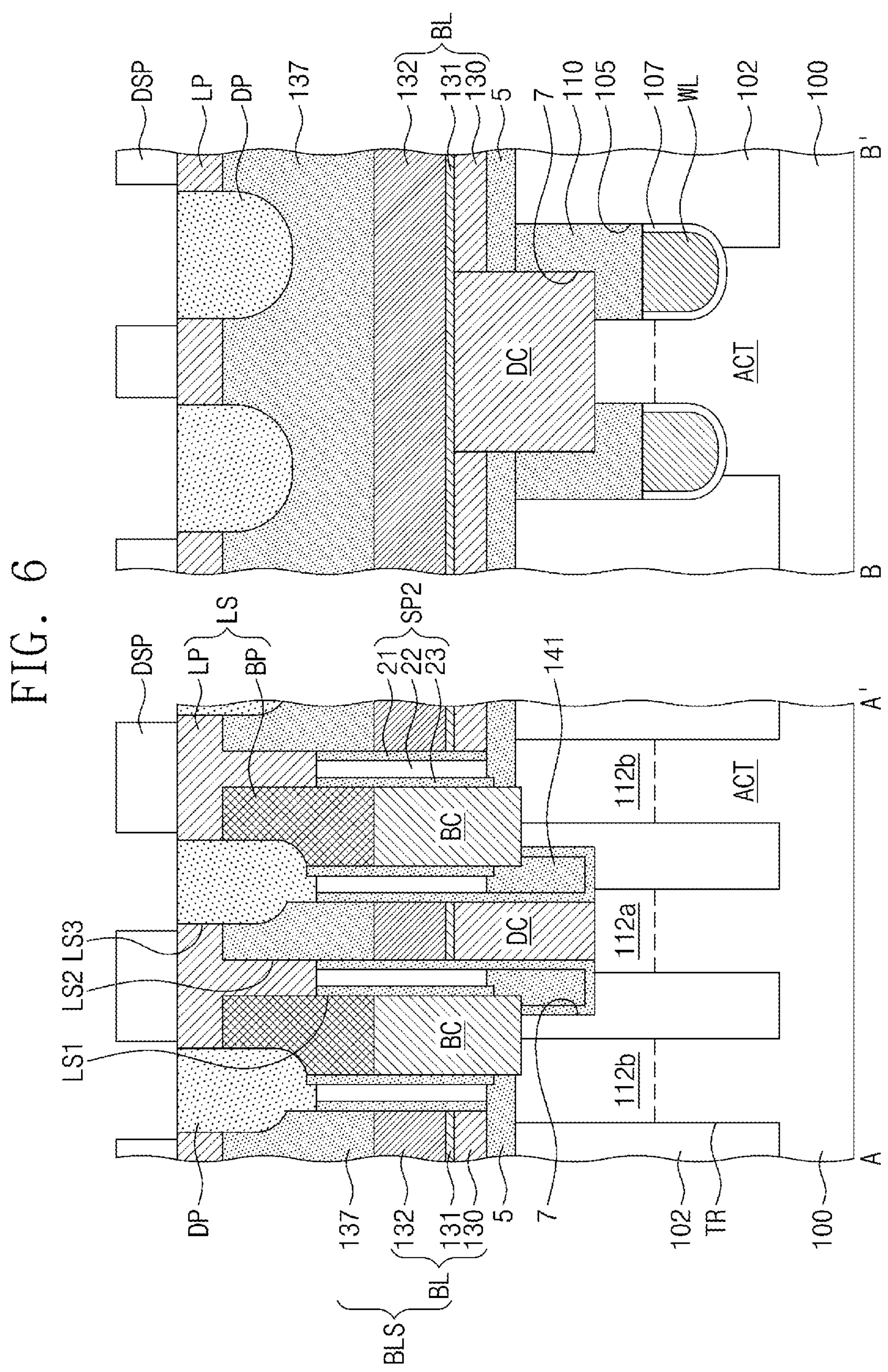
FIG. 6 is a cross-sectional view taken along lines A-A' and B-B' of FIG. 5.

FIG. 5 is a plan view of a semiconductor memory device according to some embodiments of the present disclosure. FIG. 6 is a cross-sectional view taken along lines A-A' and B-B' of FIG. 5.

Referring to FIGS. 5 and 6, a semiconductor memory device may include a spacer structure SP2 different from the spacer structure SS of FIG. 2.

The spacer structure SP2 may be a multilayer spacer. For example, the spacer structure SP2 may include a first sub-spacer 21, a second sub-spacer 22, and a third sub-spacer 23. The first sub-spacer 21 may be in contact with the bit line structure BLS. The third sub-spacer 23 may be in contact with the storage node contact BC and the barrier pattern BP. The first sub-spacer 21 and the third sub-spacer 23 may include the same material. For example, the first sub-spacer 21 and the third sub-spacer 23 may include silicon nitride. The first sub-spacer 21 and the third sub-spacer 23 may be spaced apart from each other with the second sub-spacer 22 therebetween. The second sub-spacer 22 may include a material different from that of the first sub-spacer 21 and the third sub-spacer 23. For example, the second sub-spacer 22 may include silicon oxide. Other components may be substantially the same as those described with reference to FIG. 2.

Figure 15:
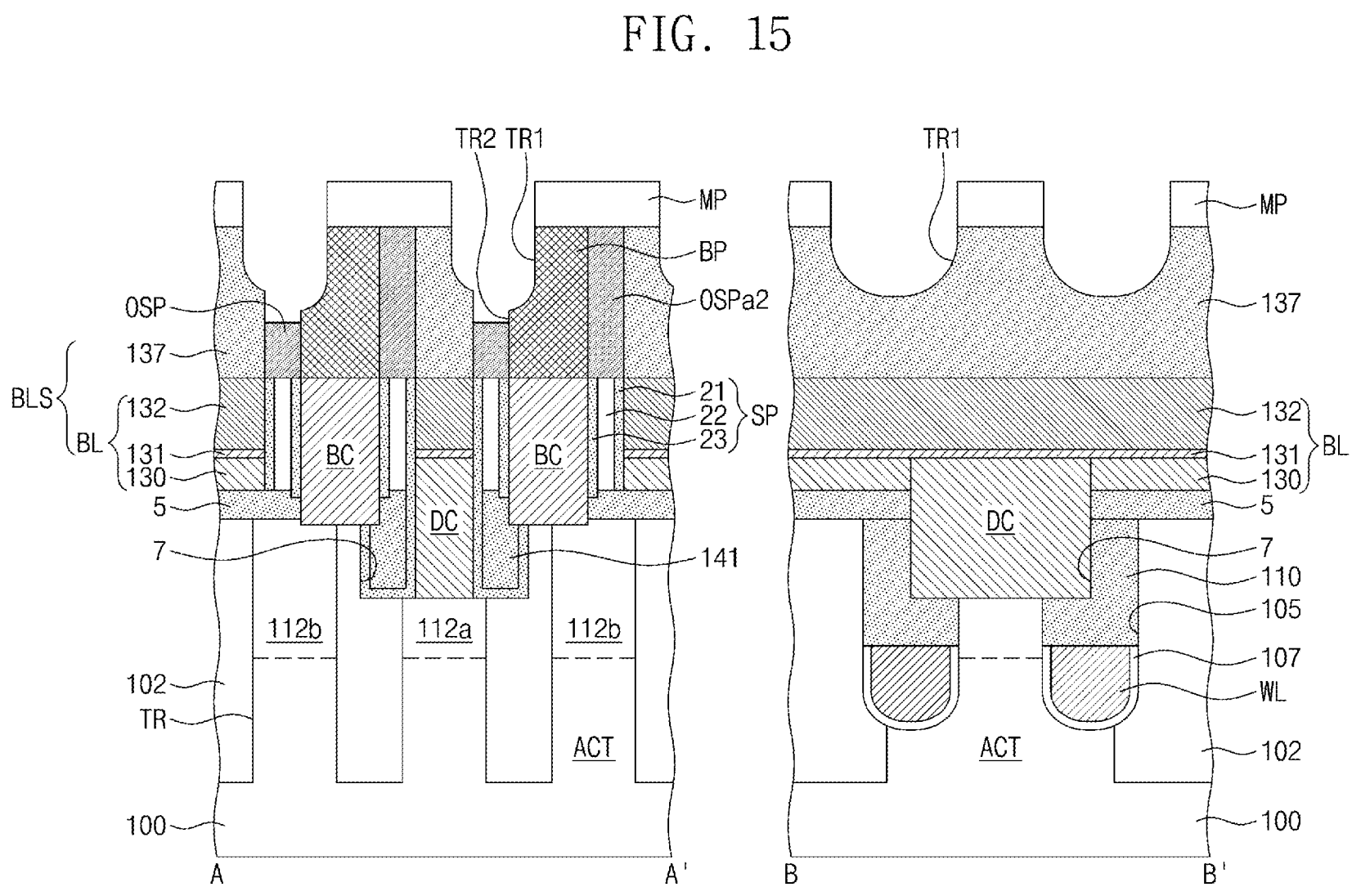
Figure 16:
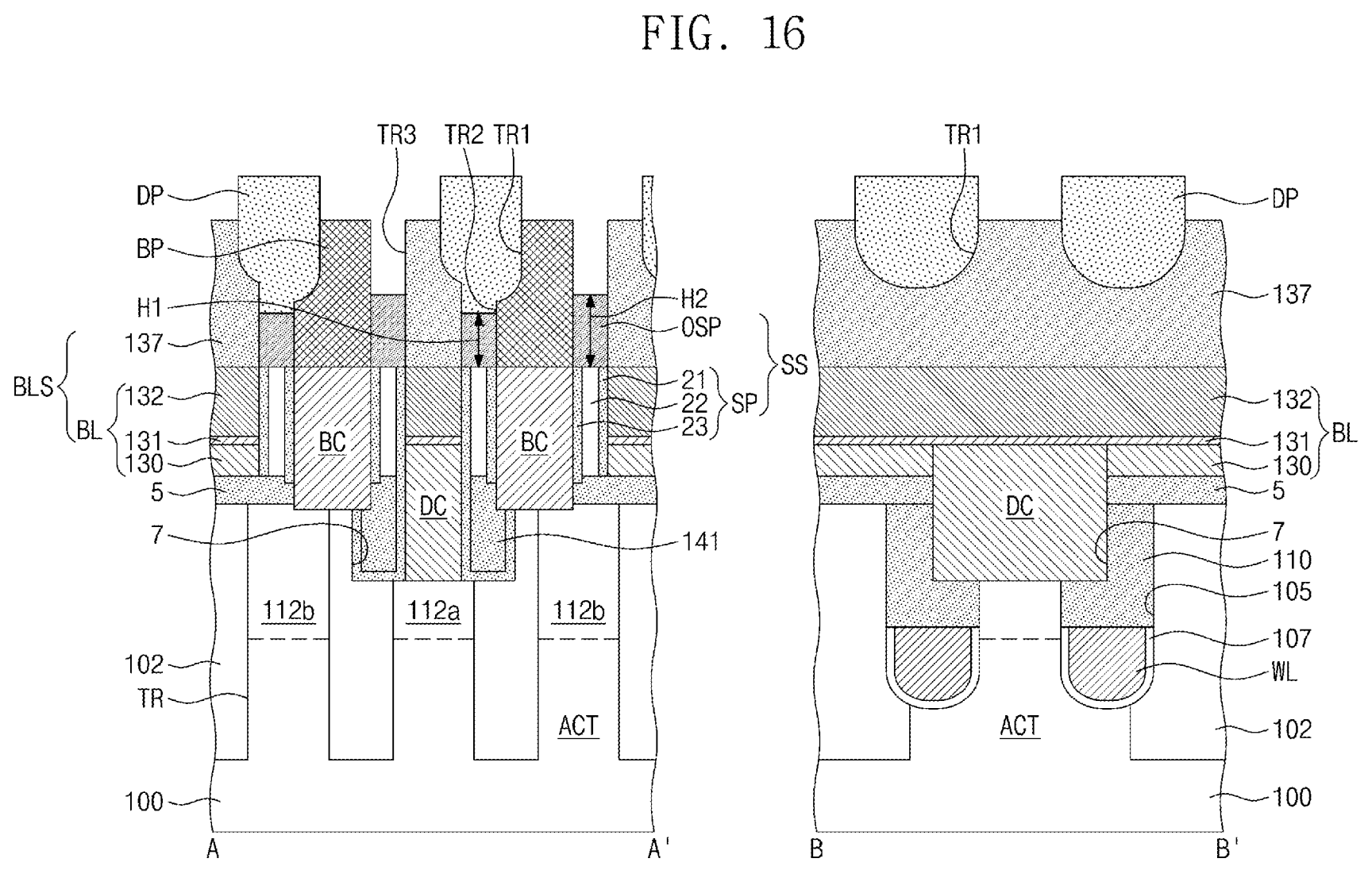

FIGS. 7A, 8A, 9A, 10A, 11A, 12A, 13A, and 14A are plan views illustrating a method of manufacturing a semiconductor memory device according to some embodiments of the present disclosure. FIGS. 7B, 8B, 9B, 10B, 11B, 12B, 13B, and 14B are cross-sectional views taken along lines A-A' and B-B' of FIGS. 7A, 8A, 9A, 10A, 11A, 12A, 13A, and 14A, respectively. FIGS. 15 and 16 are cross-sectional views taken along lines A-A' and B-B' of FIG. 14B.

Figure 7A:
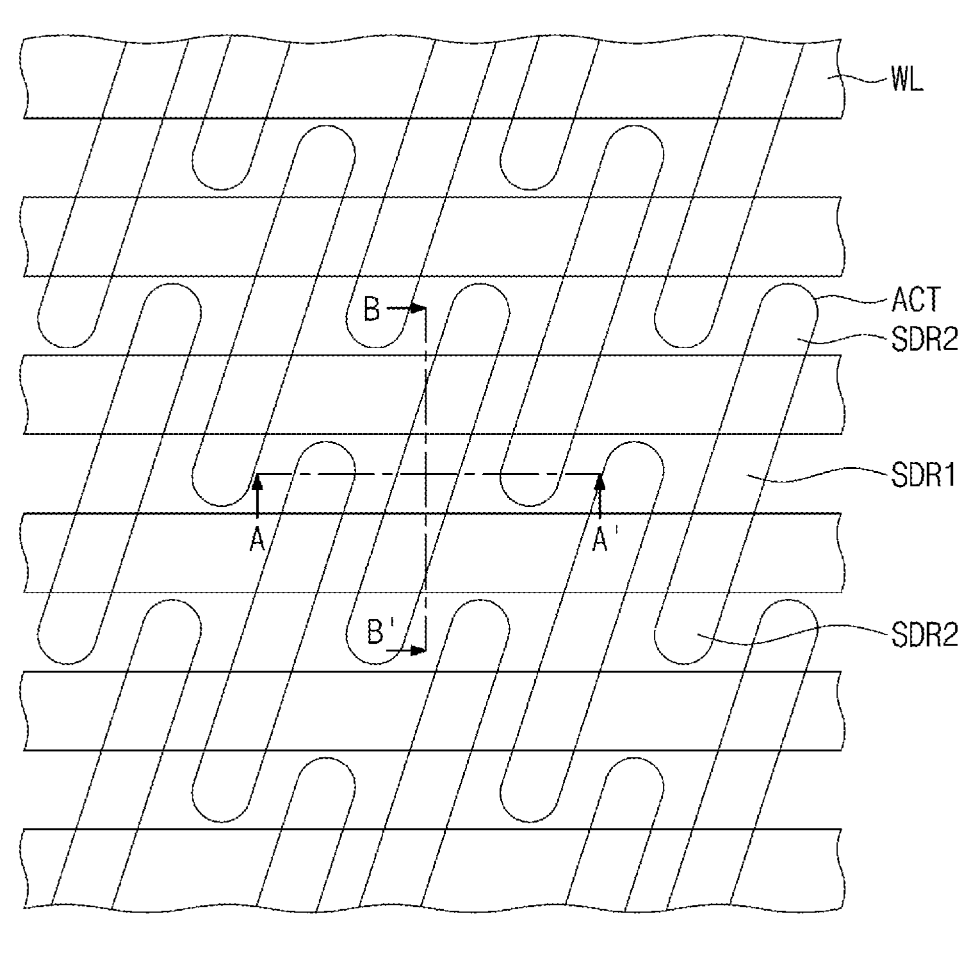
FIGS. 7A, 8A, 9A, 10A, 11A, 12A, 13A, and 14A are plan views illustrating a method of manufacturing a semiconductor memory device according to some embodiments of the present disclosure.
Figure 7B:
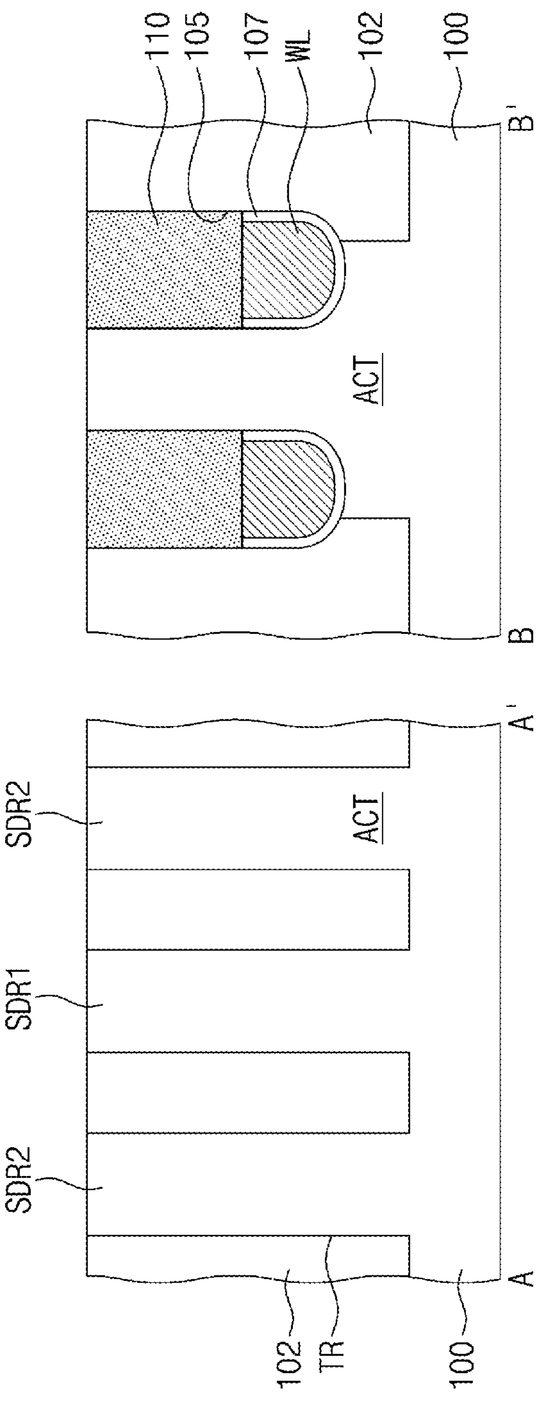

Referring to FIGS. 7A and 7B, a device isolation layer 102 may be formed on a substrate 100 to define active patterns ACT. For example, the substrate 100 may be a semiconductor substrate including silicon, germanium, or silicon-germanium. The device isolation layer 102 may be formed in trenches TR on the substrate 100. The device isolation layer 102 may include at least one of silicon oxide, silicon nitride, or silicon oxynitride. The active patterns ACT may have a bar shape extending in a first direction D1 when viewed in a plan view. The active patterns ACT may be arranged in parallel in the first direction D1 when viewed in a plan view. The active patterns ACT and the device isolation layer 102 may be patterned to form recess regions 105. The recess regions 105 may cross the active patterns ACT. A gate dielectric layer 107 may be formed in the recess regions 105. The gate dielectric layer 107 may be formed through a thermal oxidation process, a chemical vapor deposition process, and/or an atomic layer deposition process. The gate dielectric layer 107 may be formed of, for example, silicon oxide, silicon nitride, and/or metal oxide. Subsequently, a gate conductive layer may be formed to fill the recess regions 105, and the gate conductive layer may be etched to form word lines WL in the recess regions 105. The gate conductive layer may be formed of, for example, polysilicon doped with impurities, a metal nitride, and/or a metal. Upper surfaces of the word lines WL may be recessed lower than upper surfaces of the active patterns ACT. The word lines WL may be formed to extend in a second direction D2 crossing the first direction D1. The word lines WL may cross the active patterns ACT. The active patterns ACT may be divided into a first region SDR1 and a pair of second regions SDR2 by a pair of word lines WL. The first region SDR1 may be defined between the pair of word lines WL, and the pair of second regions SDR2 may be defined as both edge regions of the active patterns ACT. An insulating material such as silicon nitride may be deposited on the substrate 100 to fill the recess regions 105 and then may be etched to form a word line capping pattern 110 on the word lines WL.

Figure 8A:
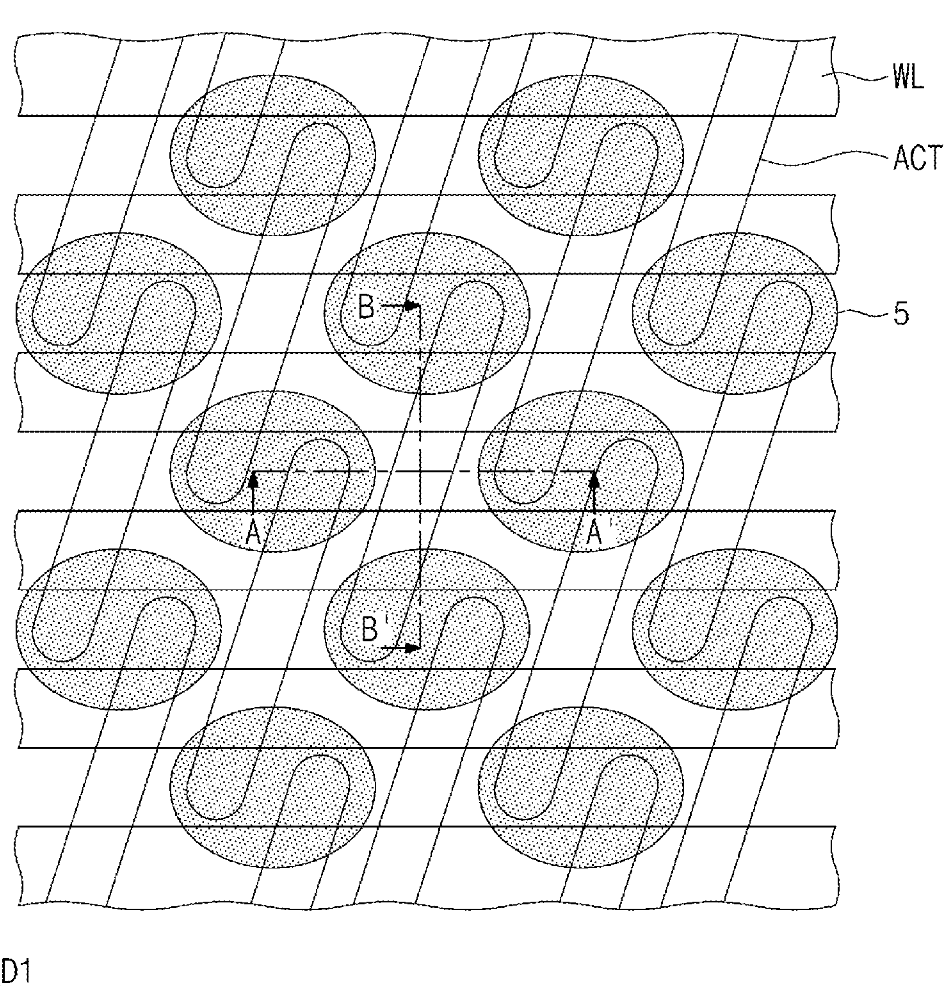
Figure 8A:
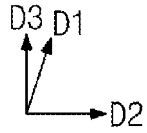
Figure 8B:
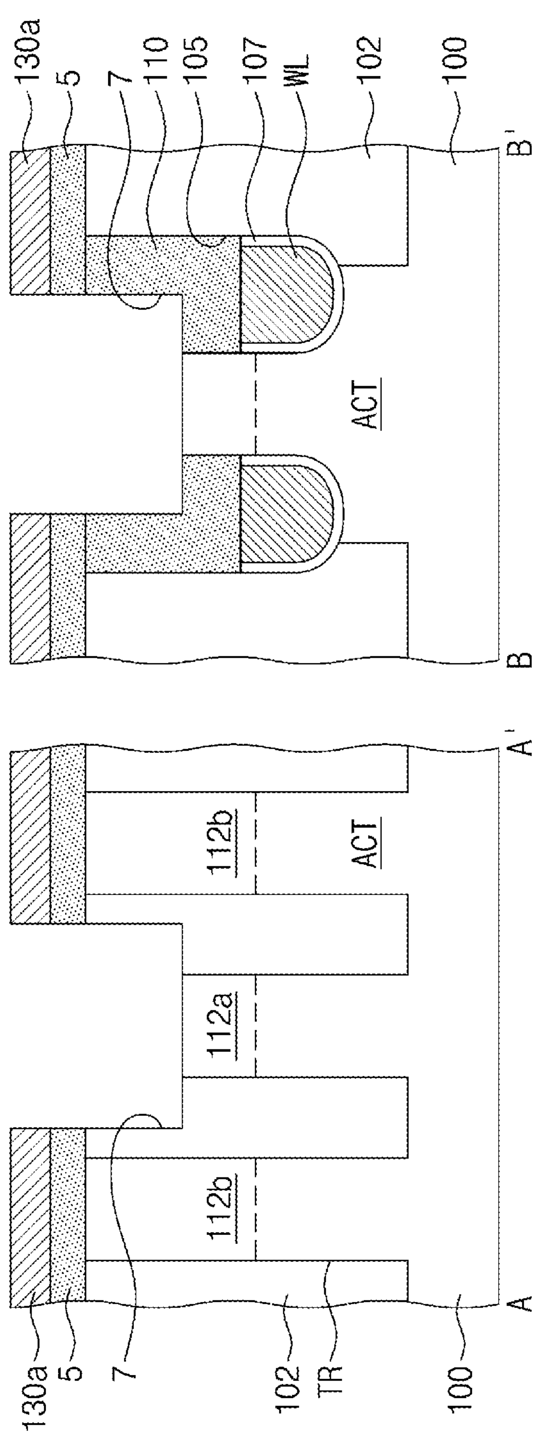

Referring to FIGS. 8A and 8B, first and second source/drain regions 112*a* and 112*b* may be formed. The first source/drain region 112*a* and the second source/drain region 112*b* may be formed in the first region SDR1 and the second regions SDR2 of the active patterns ACT described above, respectively. An insulating layer and a first polysilicon layer may be deposited on the entire surface of the substrate 100 and then may be patterned to form a first polysilicon pattern 130*a*. The insulating layer, the device isolation layer 102, the substrate 100, and the word line capping pattern 110 may be etched using the first polysilicon pattern 130*a* as an etch mask to form the wiring-contact opening 7 and an interlayer insulating pattern 5. The interlayer insulating pattern 5 may be formed in a shape of a plurality of islands (e.g., a round shape) spaced apart from each other. The interlayer insulating pattern 5 may be formed to simultaneously cover end portions of two adjacent active patterns ACT. The wiring-contact opening 7 may be formed in a mesh shape when viewed in a plan view. The wiring-contact opening 7 may expose the first source/drain regions 112*a*.

Figure 9A:
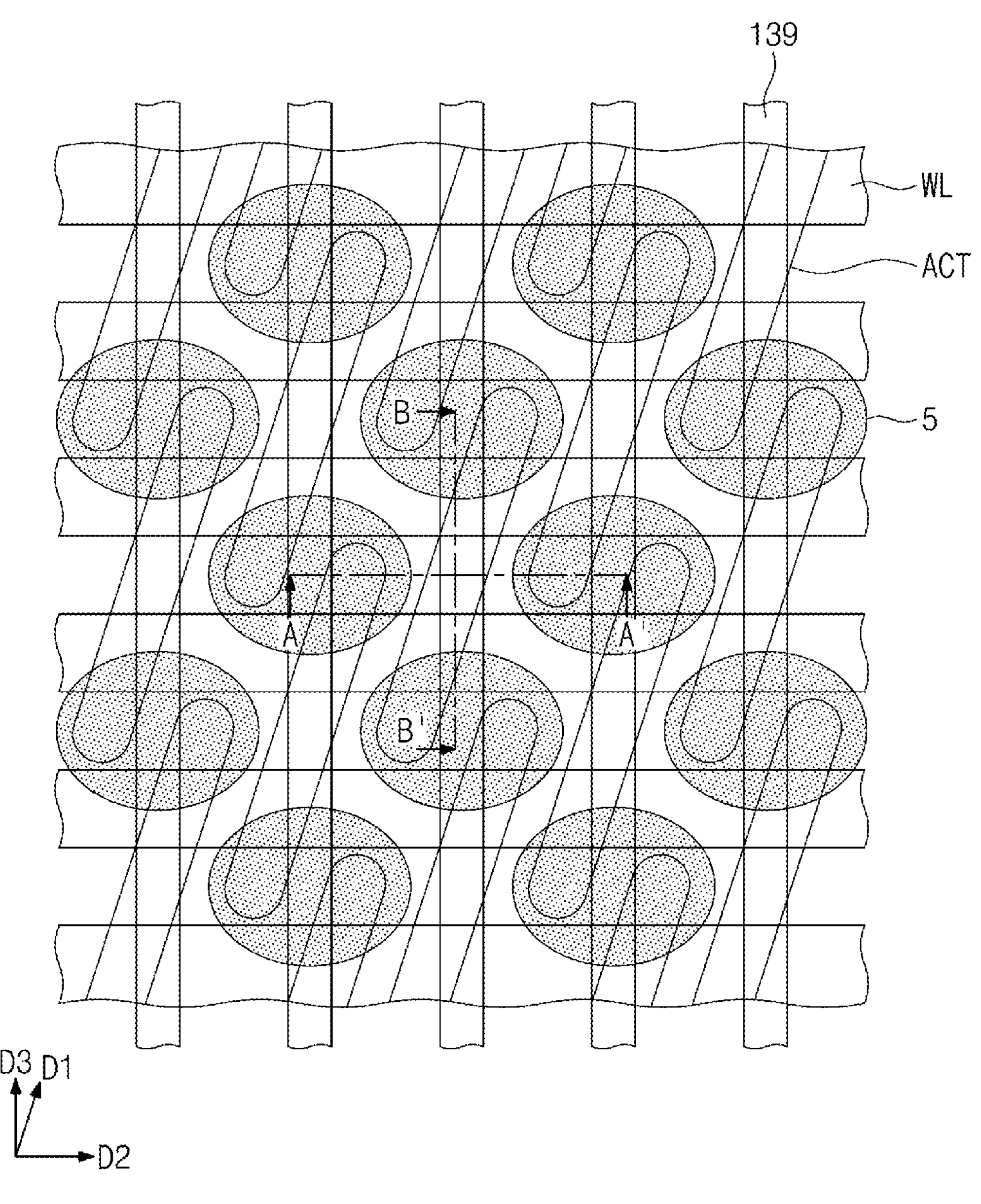
Figure 9B:
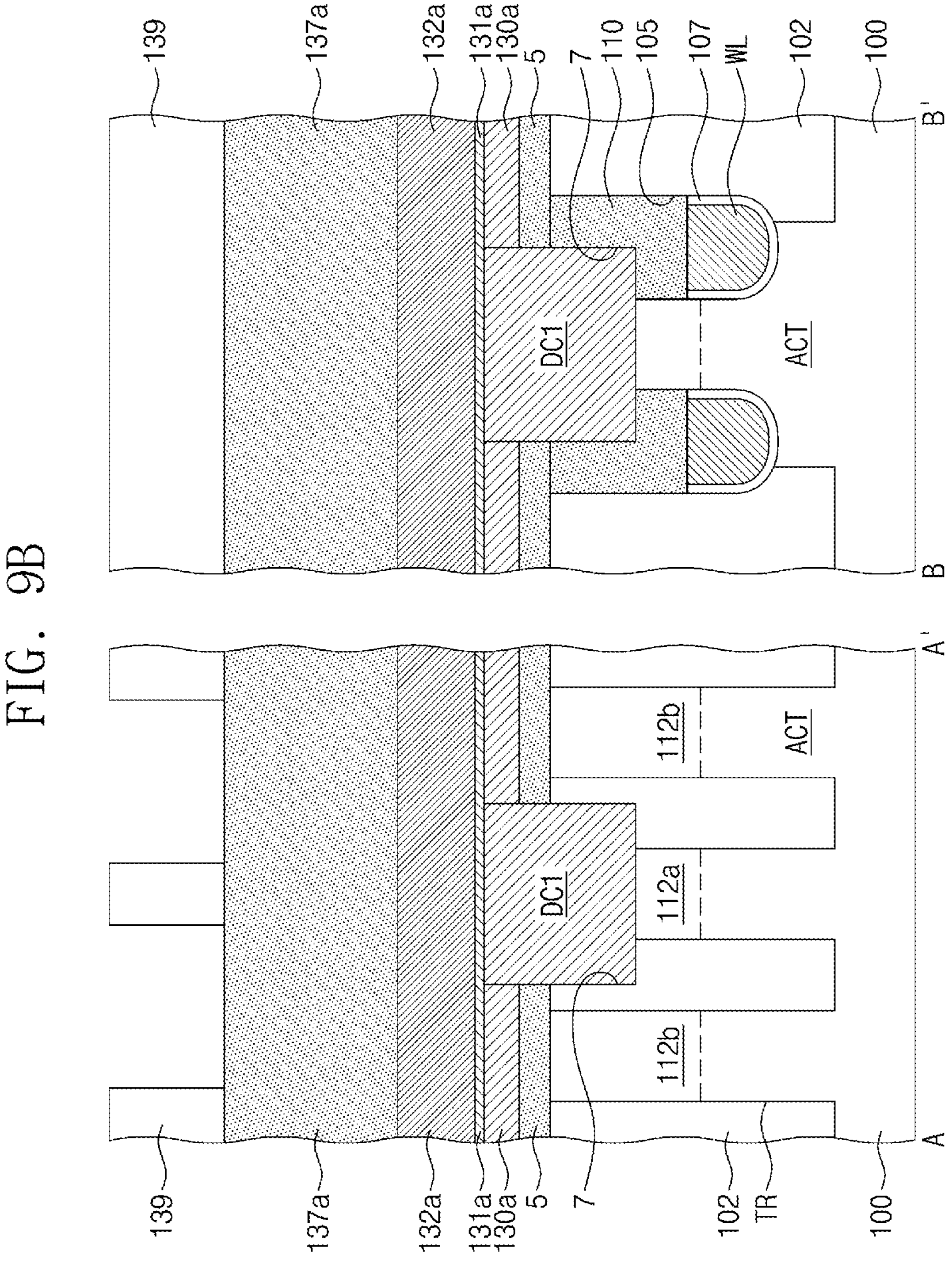

Referring to FIGS. 9A and 9B, a second polysilicon layer may be deposited on the entire surface of the substrate 100 to fill the wiring-contact opening 7 and then a planarization etching process may be performed to form a second polysilicon pattern DC1. A bit line diffusion barrier layer 131*a*, a bit line metal layer 132*a*, and a bit line capping layer 137*a* may be sequentially deposited on the first polysilicon pattern 130*a* and the second polysilicon pattern DC1. The bit line diffusion barrier layer 131*a* may include a metal nitride such as titanium nitride. The bit line metal layer 132*a* may include a metal nitride such as titanium nitride and/or a metal such as tungsten. The bit line capping layer 137*a* may include silicon nitride. First mask patterns 139 defining a planar shape of the bit line structure may be formed on the bit line capping layer 137*a*.

Figure 10A:
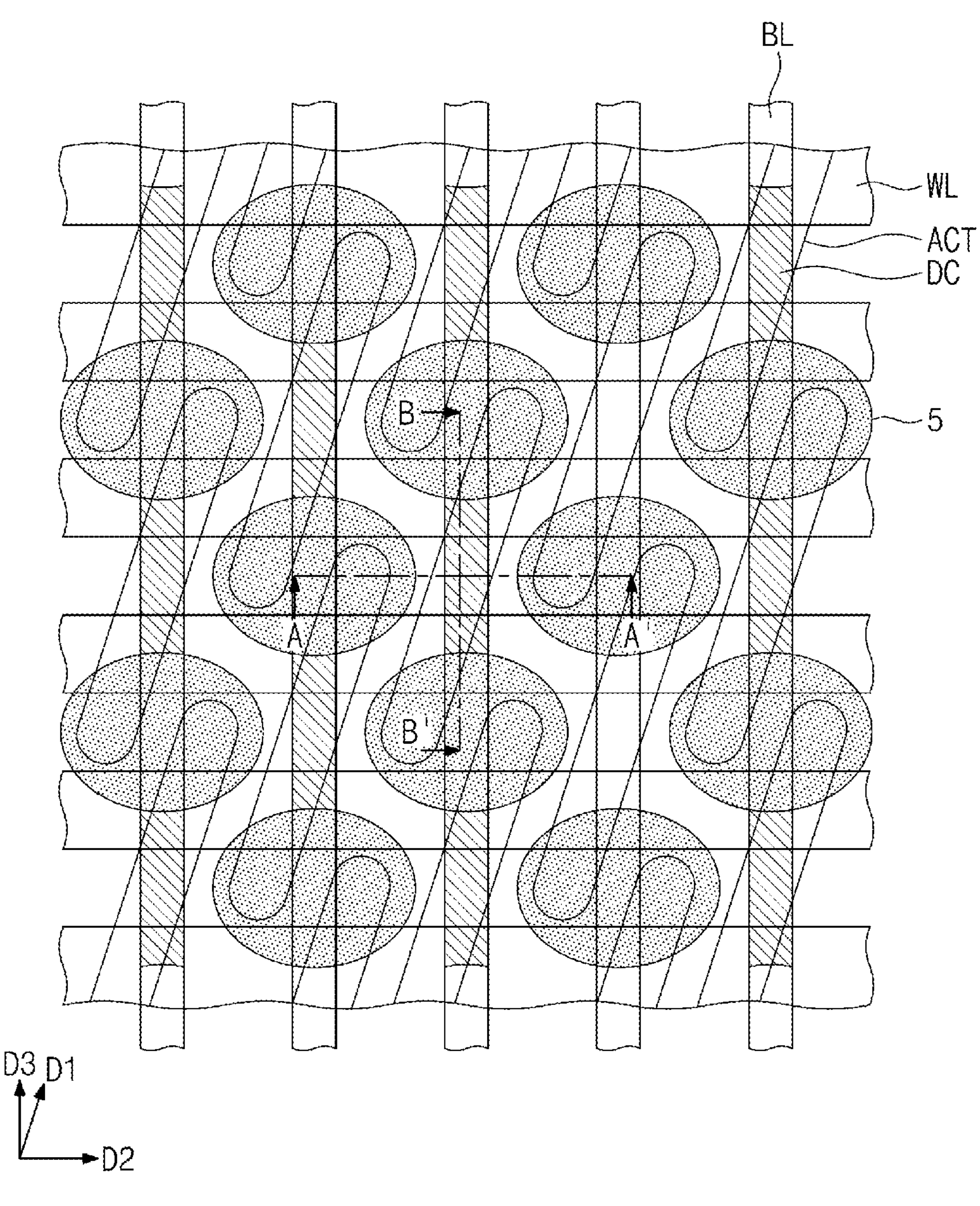
Figure 10B:
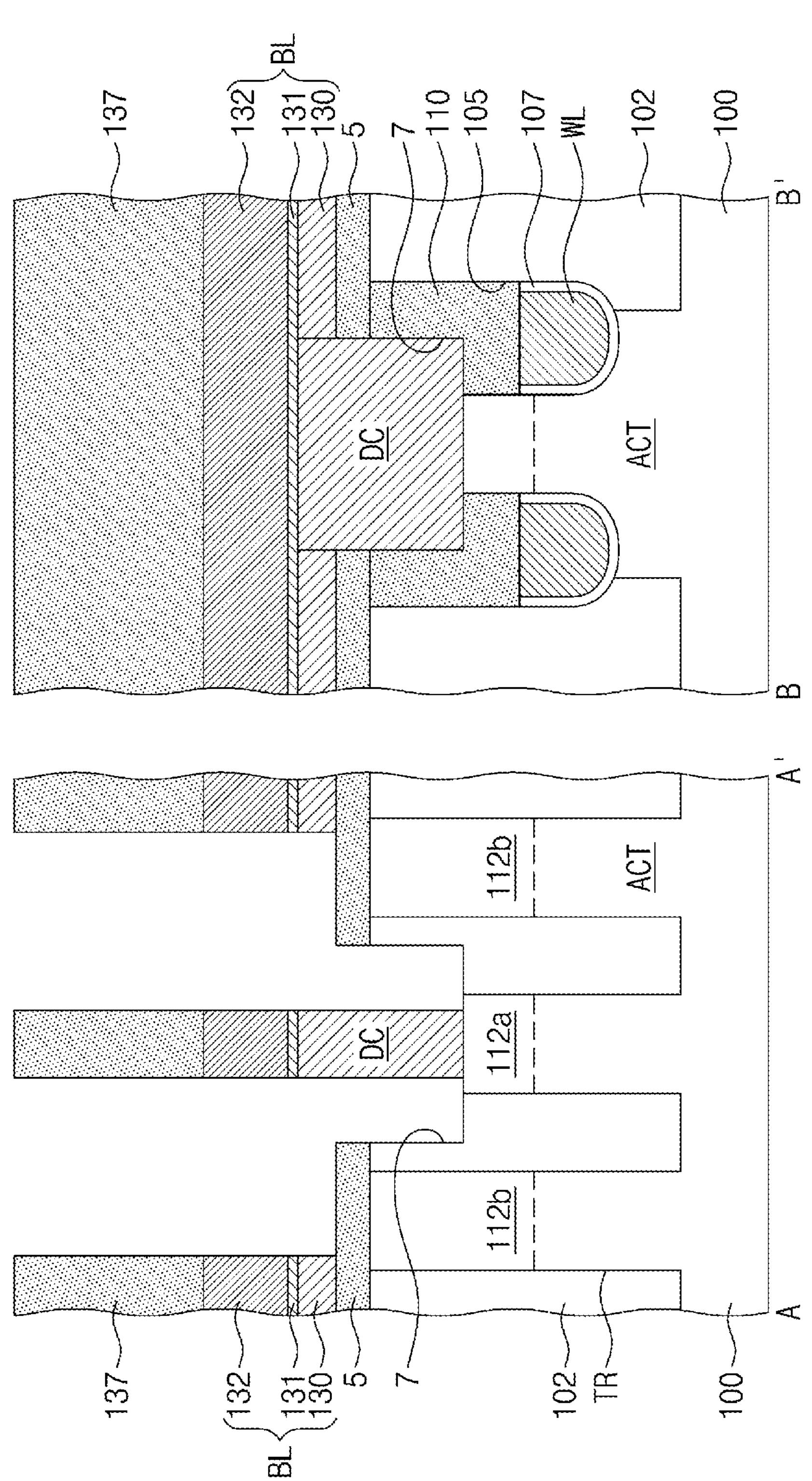

Referring to FIGS. 10A and 10B, the first polysilicon pattern 130*a*, the bit line diffusion barrier layer 131*a*, the bit line metal layer 132*a*, and the bit line capping layer 137*a* may be etched using the first mask pattern 139 as an etching mask to form a bit line BL and a bit line capping pattern 137. The bit line BL may include a bit line polysilicon pattern 130, a bit line diffusion barrier pattern 131, and a bit line metal pattern 132. In addition, the second polysilicon pattern DC1 may be etched to form a bit line contact DC. Accordingly, portions of an upper surface of the interlayer insulating pattern 5 and an inner wall and bottom surface of the wiring-contact opening 7 may be exposed.

Figure 11A:
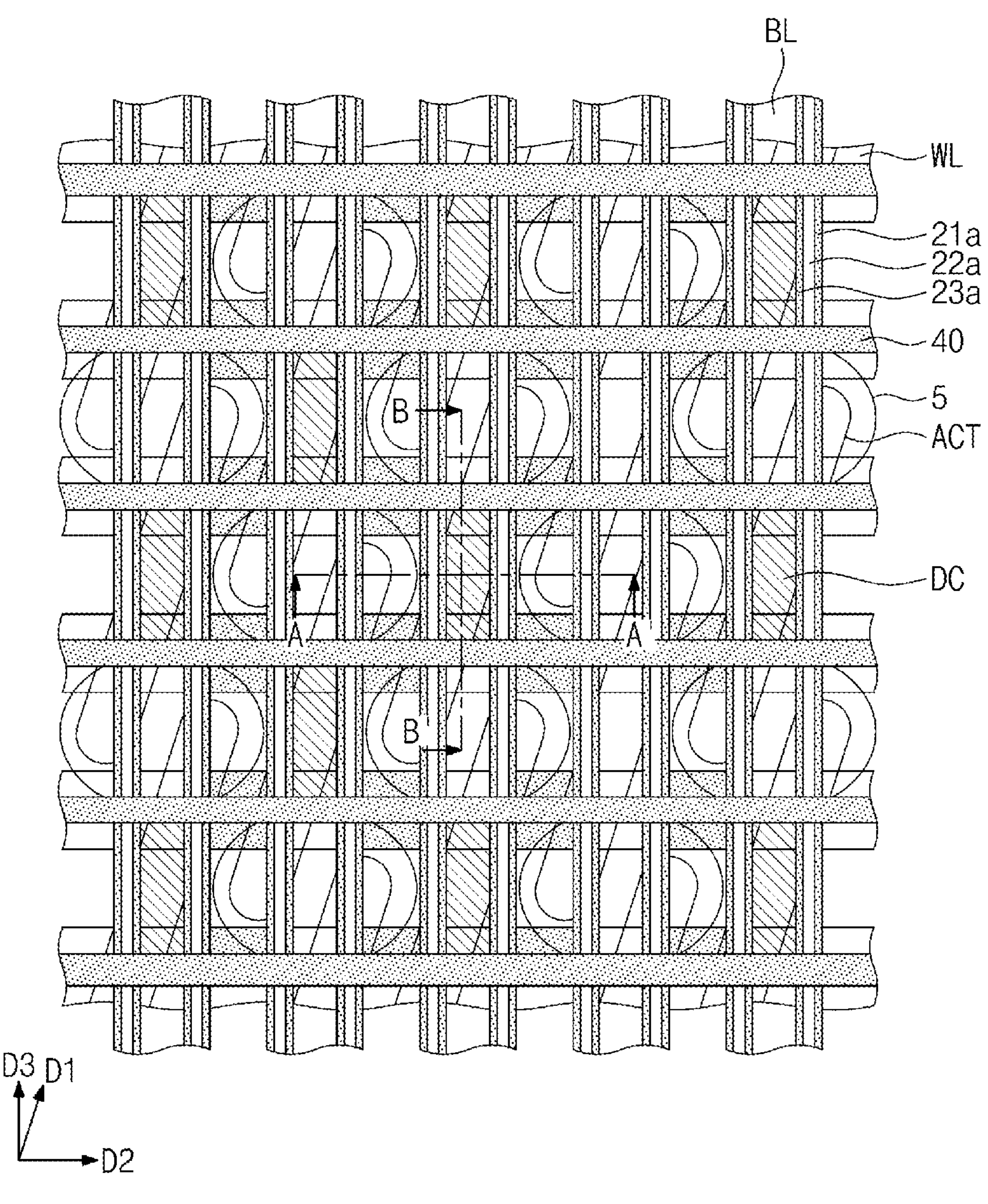
Figure 11B:
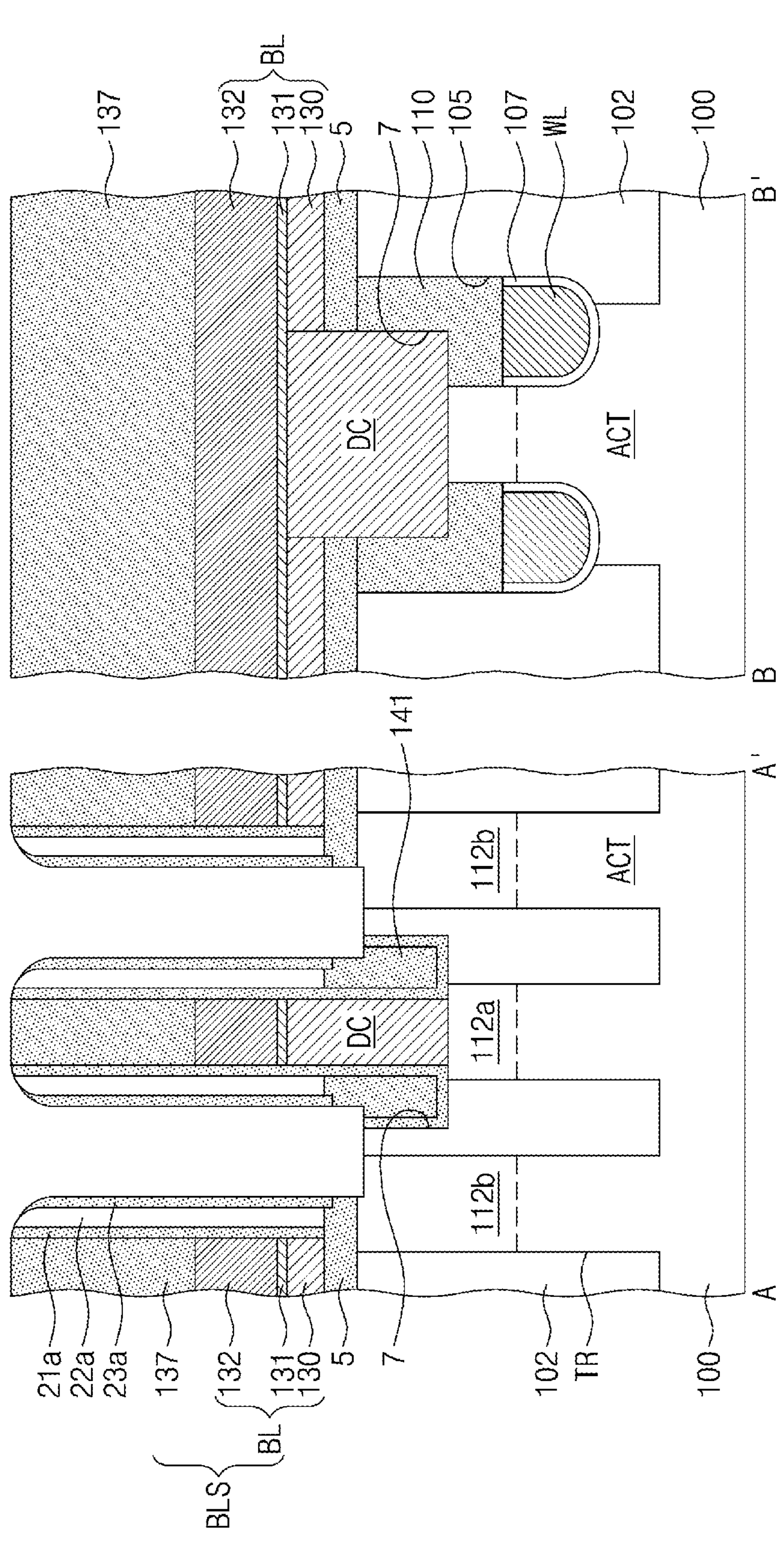

Referring to FIGS. 11A and 11B, a first spacer layer formed of silicon nitride may be conformally formed on the entire surface of the substrate 100. The first spacer layer may conformally cover the inner wall and the bottom surface of the wiring-contact opening 7. The wiring-contact opening 7 may be filled with an insulating material formed of silicon nitride on the entire surface of the substrate 100 and then an anisotropic etching may be performed to form a lower buried insulating pattern 141 in the wiring-contact opening 7. The first spacer layer may also be etched through the anisotropic etching to form a first preliminary spacer 21*a*, and an upper surface of the interlayer insulating pattern 5 may be exposed. A second spacer layer formed of silicon oxide may be conformally formed on the entire surface of the substrate 100, and then anisotropic etching may be performed to form a second preliminary spacer 22*a* covering the first preliminary spacer 21*a*. Thereafter, a third spacer layer formed of silicon nitride may be conformally formed on the entire surface of the substrate 100, and then anisotropic etching may be performed to form the third preliminary spacer 23*a*. In this case, an upper surface of the interlayer insulating pattern 5 may be exposed. A portion of the interlayer insulating pattern 5 may be etched to expose the second source/drain regions 112*b* of the substrate 100. Thereafter, an insulating material such as silicon nitride may be deposited on the entire surface of the substrate 100 and may be patterned to form an insulation fence 40 between adjacent third preliminary spacers 23*a* to define a location of a storage node contact BC, which will be described later.

Figure 12A:
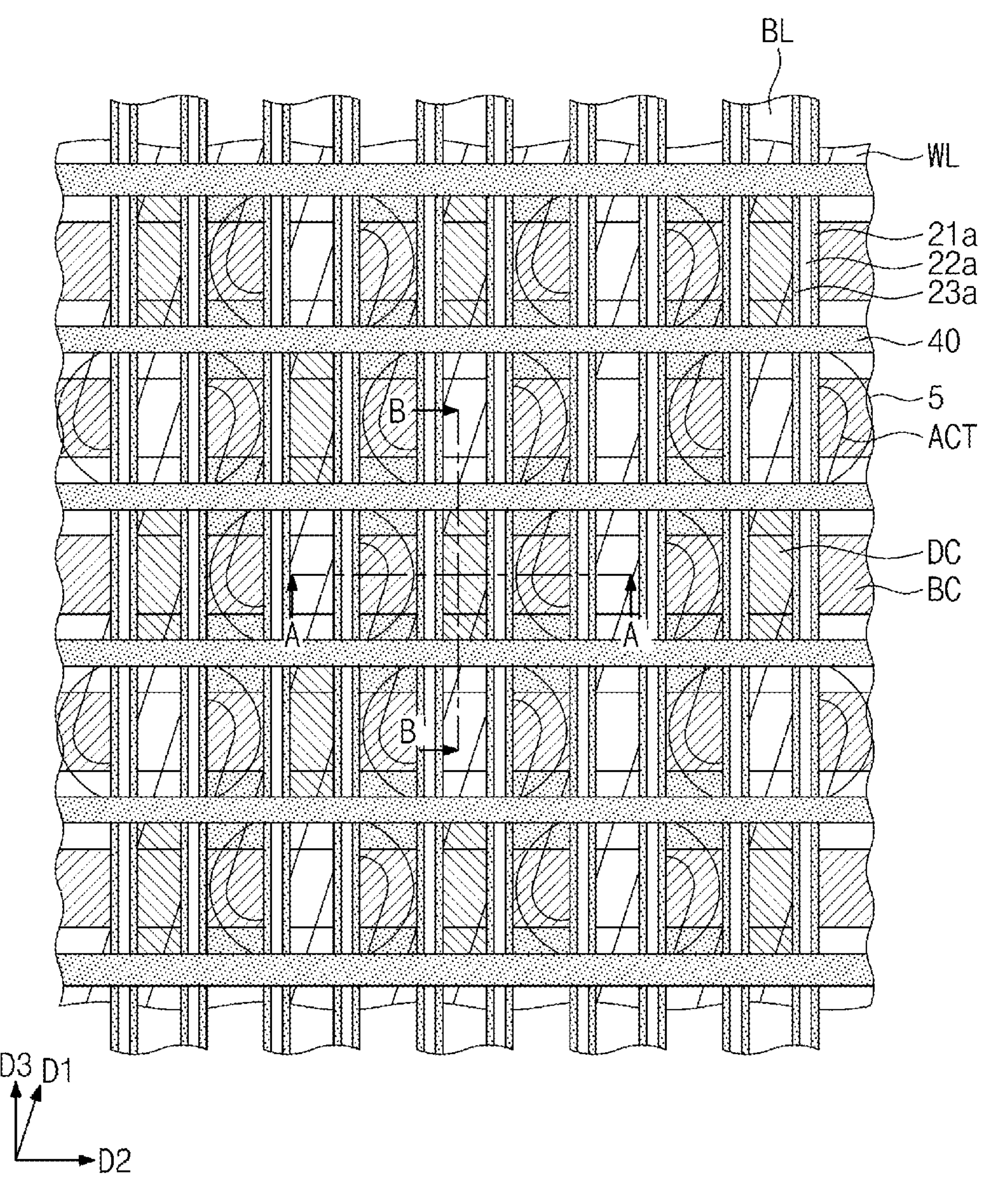
Figure 12B:
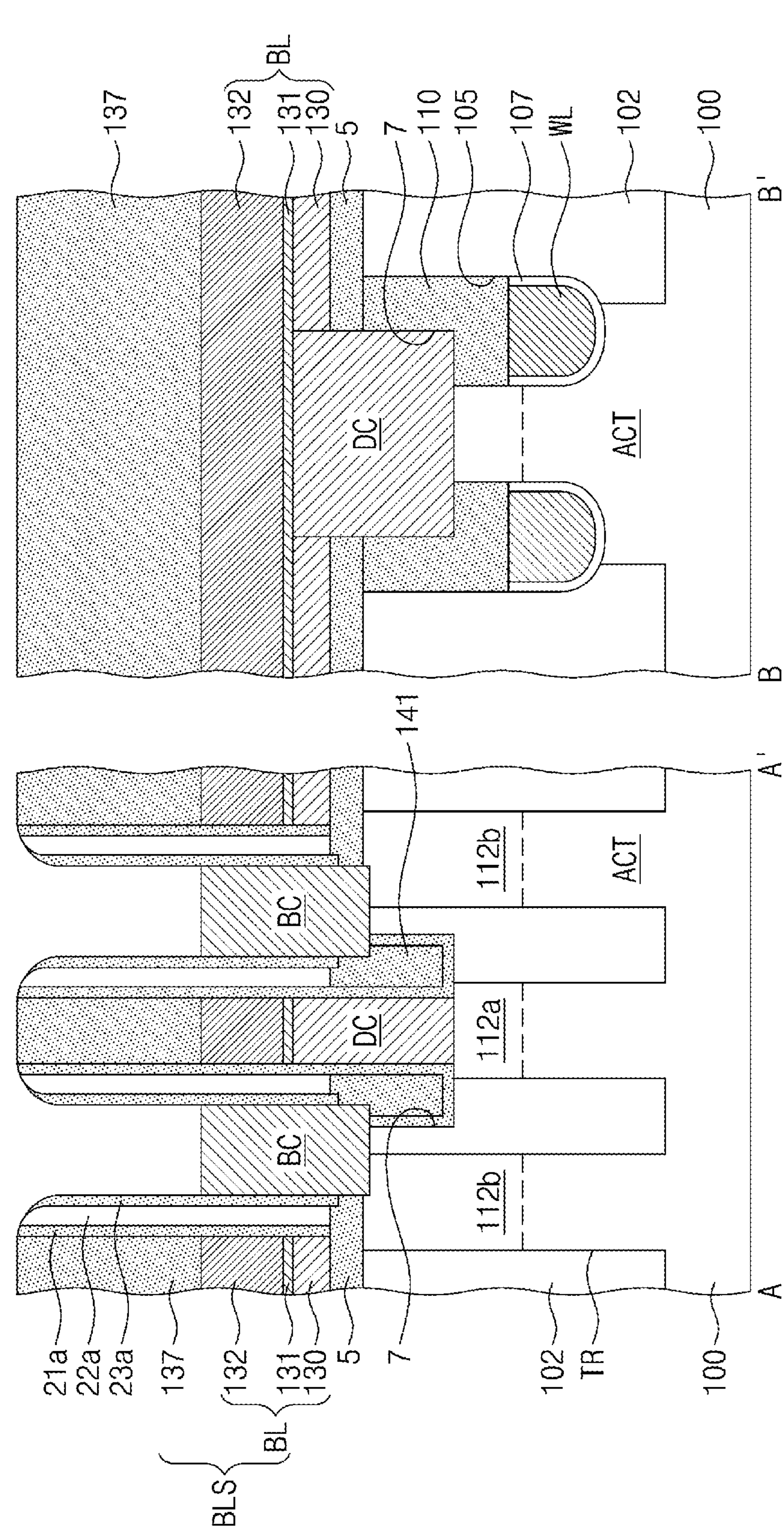

Referring to FIGS. 12A and 12B, a polysilicon layer doped with impurities may be deposited on the entire surface of the substrate 100 and may be etched to form a storage node contact BC between the adjacent third preliminary spacers 23*a*. The storage node contact BC may be formed to have an upper surface lower than the bit line capping pattern 137.

Figure 13A:
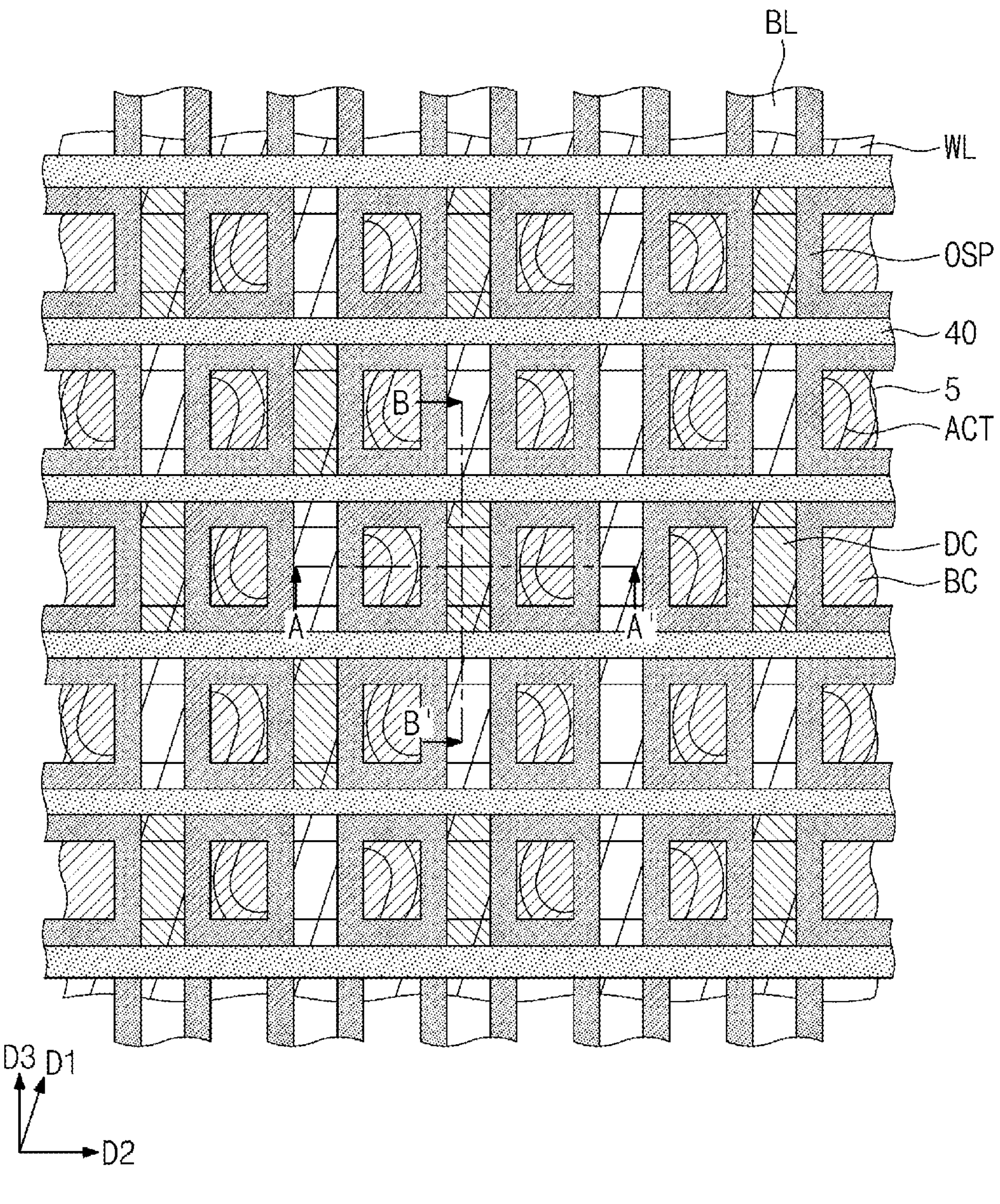
Figure 13B:
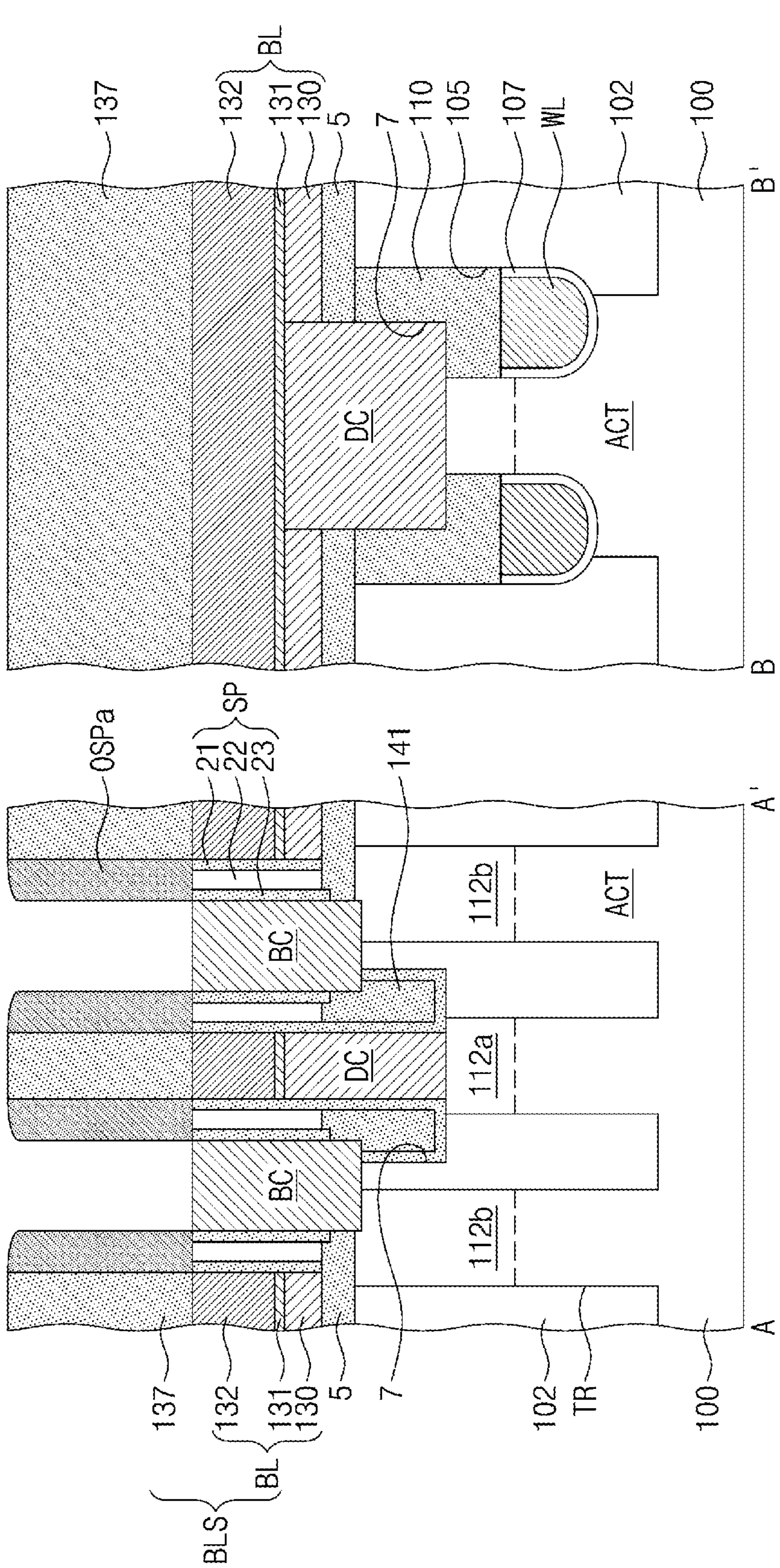

Referring to FIGS. 13A and 13B, upper portions of each of the first preliminary spacer 21*a*, the second preliminary spacer 22*a*, and the third preliminary spacer 23*a* may be etched to form a first spacer SP including a first sub-spacer 21, a second sub-spacer 22, and a third sub-spacer 23. The etching process of the first preliminary spacer 21*a*, the second preliminary spacer 22*a*, and the third preliminary spacer 23*a* may be performed until an upper surface of each of the first preliminary spacer 21*a*, the second preliminary spacer 22*a*, and the third preliminary spacer 23*a* is positioned at substantially the same vertical level as the upper surface of the storage node contact BC.

An oxide layer may be conformally formed on the entire surface of the substrate 100. The oxide layer may be formed to cover an upper surface of the first spacer SP, an upper surface of the storage node contact BC, the bit line capping pattern 137, and the insulation fence 40. An etch-back process may be performed on the oxide layer to form an oxide spacer layer OSPa having a closed curve shape when viewed in a plan view. In some embodiments, the oxide spacer layer OSPa may have a quadrilateral shape in a plan view. An upper surface of the storage node contact BC and an upper surface of the bit line capping pattern 137 may be exposed by the etch-back process. The oxide spacer layer OSPa may include, for example, silicon oxide.

Figure 14A:
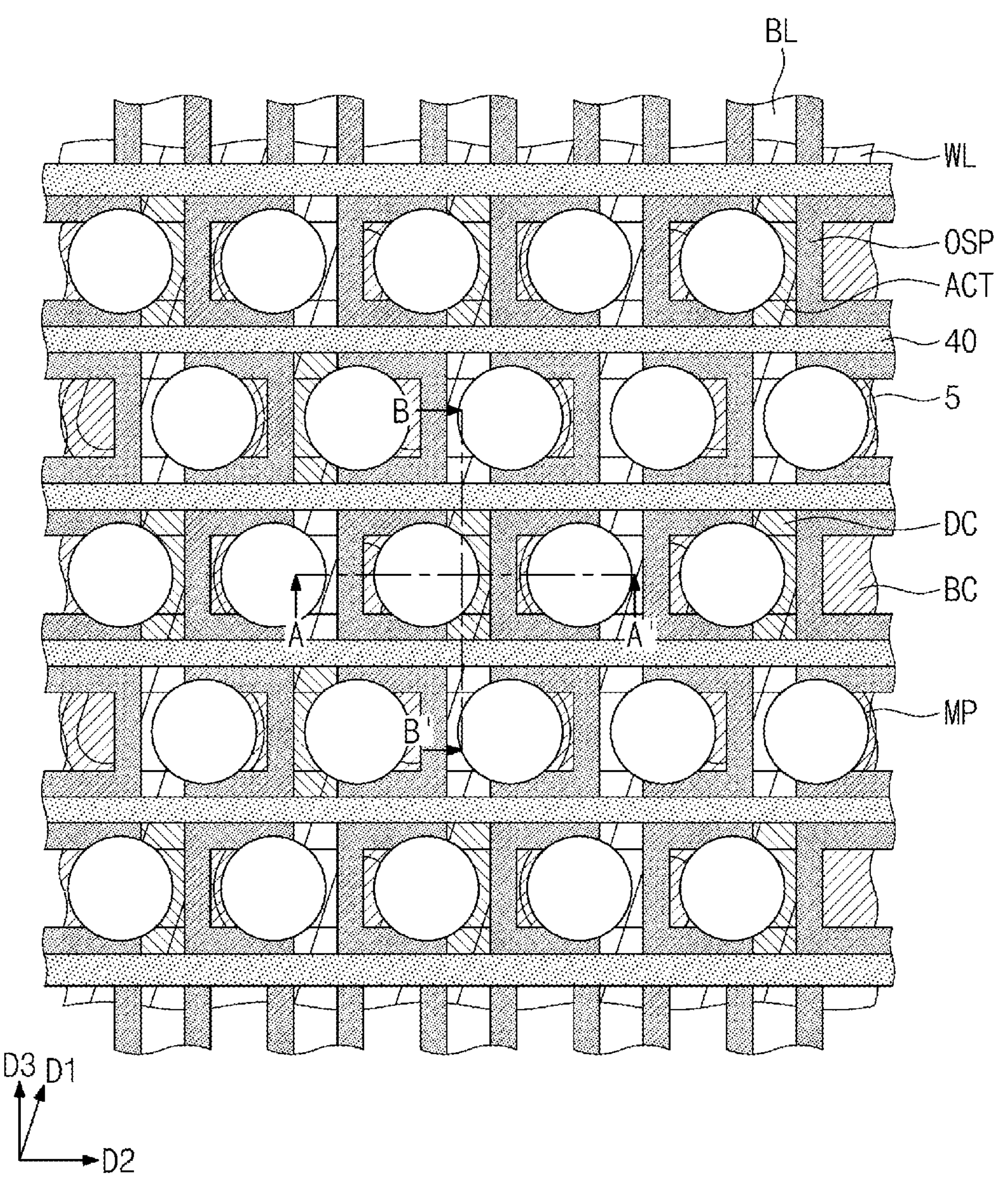
Figure 14B:
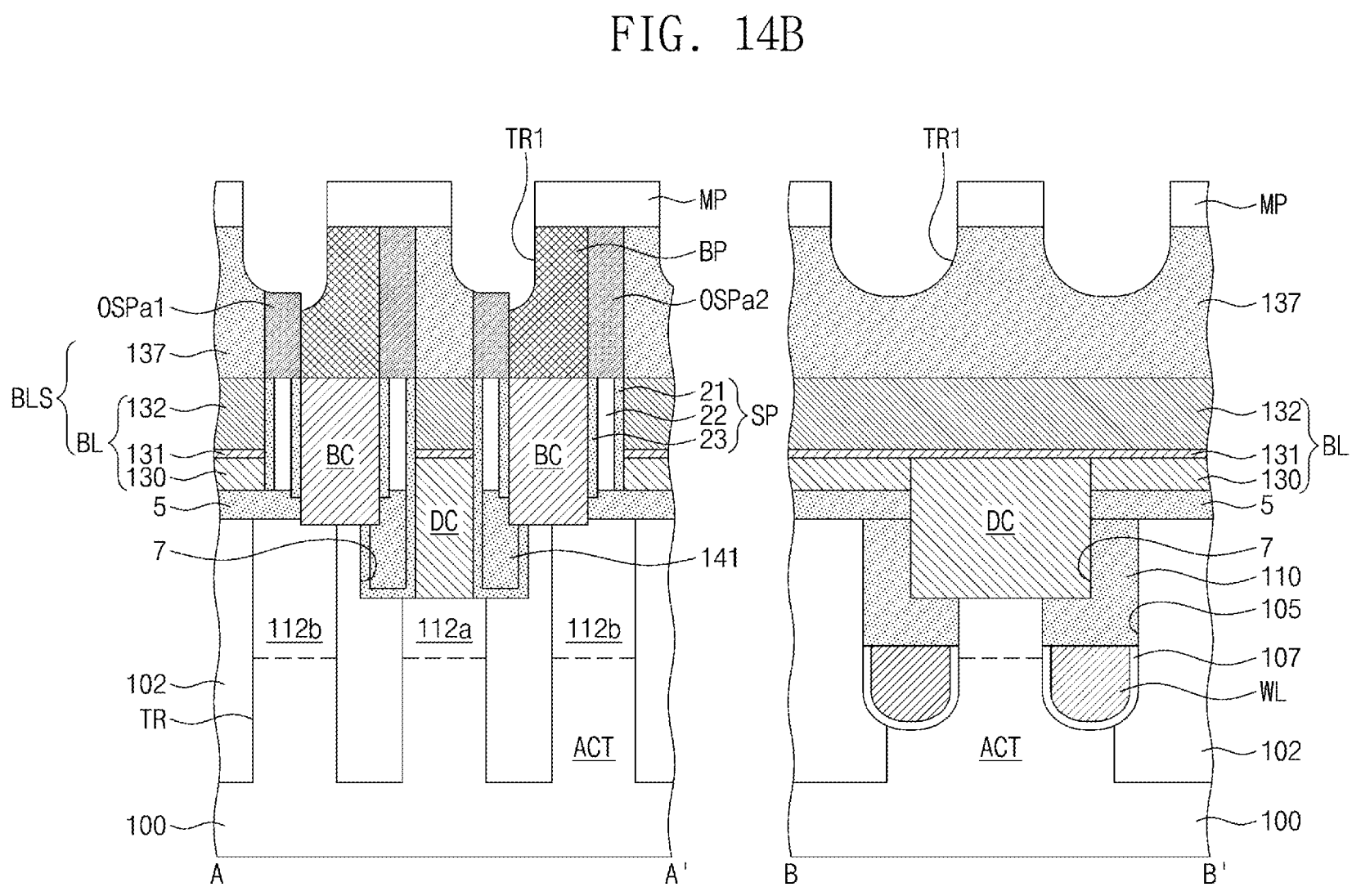

Referring to FIGS. 14A and 14B, a conductive material may be deposited between adjacent oxide spacer layers OSPa to form a barrier pattern BP. The conductive material may include, for example, titanium nitride. A planarization etch process may be performed on the bit line capping pattern 137, the oxide spacer layer OSPa, and the barrier pattern BP, and thus upper surfaces of the bit line capping pattern 137, the oxide spacer layer OSPa, and the barrier pattern BP may be coplanar. A second mask pattern MP may be formed on each of upper surfaces of the bit line capping pattern 137, the oxide spacer layer OSPa, and the barrier pattern BP. The second mask pattern MP may be formed in a shape of a plurality of islands (e.g., a round shape) spaced apart from each other. The second mask pattern MP may define a planar shape of a landing pad LP to be described later. Portions of the bit line capping pattern 137, a first oxide spacer layer OSPa1 on one side of the bit line structure BLS, and the barrier pattern BP may be etched by a first etching process using the second mask pattern MP as an etching mask to form a first trench TR1.

Referring to FIG. 15, a second etching process may be performed to further remove an upper portion of the first oxide spacer layer OSPa1 on the one side of the bit line structure BLS, thereby forming a second spacer OSP and a second trench TR2. The second etching process may be a process for removing metallic residue caused by etching the barrier pattern BP in the first etching process.

Referring to FIG. 16, an insulating pattern DP filling the first and second trenches TR1 and TR2 may be formed. Thereafter, the second mask pattern MP may be removed to expose the second oxide spacer layer OSPa2 on the other side of the bit line structure BLS. An etching process of removing a portion of an upper portion of the second oxide spacer layer OSPa2 may be performed to form a second spacer OSP and a third trench TR3, and the second spacer OSP may be formed on the first spacer SP.

Referring back to FIG. 2, a conductive material may be deposited on the entire surface of the substrate 100 to fill a gap between the third trench TR3 and the insulating patterns DP. Thereafter, a planarization etch process may be performed to form the landing pad LP. The conductive material may include tungsten. A data storage pattern DSP may be formed on the landing pad LP to manufacture a semiconductor memory device.

In the method of manufacturing the semiconductor device according to some embodiments of the present disclosure, forming the spacer structure SS may include removing the first spacer SP (e.g., removing an upper portion of the first spacer SP) that is a multilayer spacer, and then forming the second spacer OSP that is a single-layer spacer. A single-layer spacer may be etched more easily than a multi-layer spacer. Accordingly, it may be easy to form a trench for providing the landing pad LP by etching a portion of the spacer structure SS. In addition, a protruding portion of the landing pad LP may be formed in the trench to increase an area for electrical connection between the pad portion of the landing pad LP and the storage node contact BC. Thus, a semiconductor memory device with improved reliability may be provided.

Figure 17:
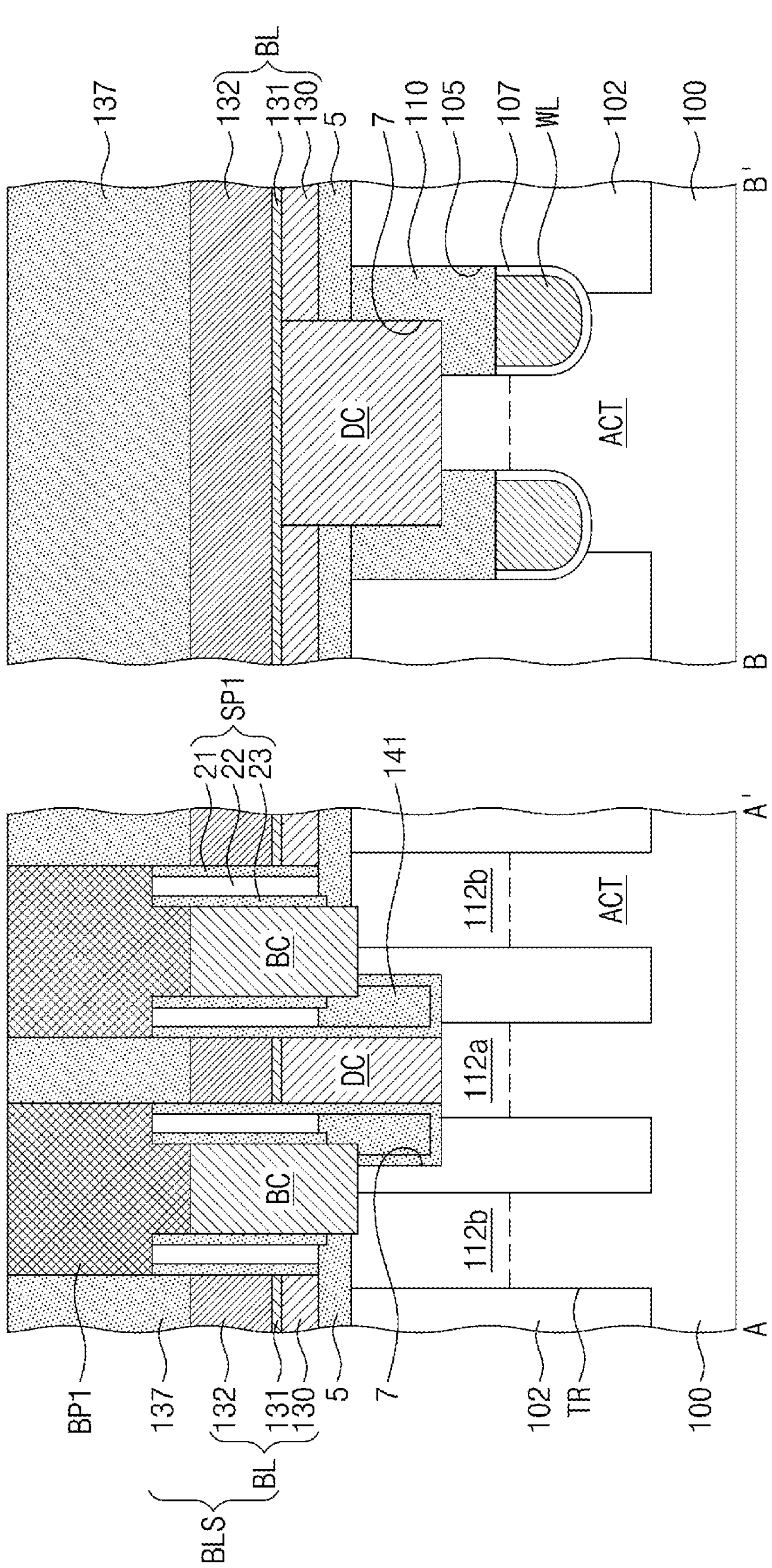
FIGS. 17 and 18 are cross-sectional views illustrating a method of manufacturing a semiconductor memory device according to some embodiments of the present disclosure.
Figure 18:
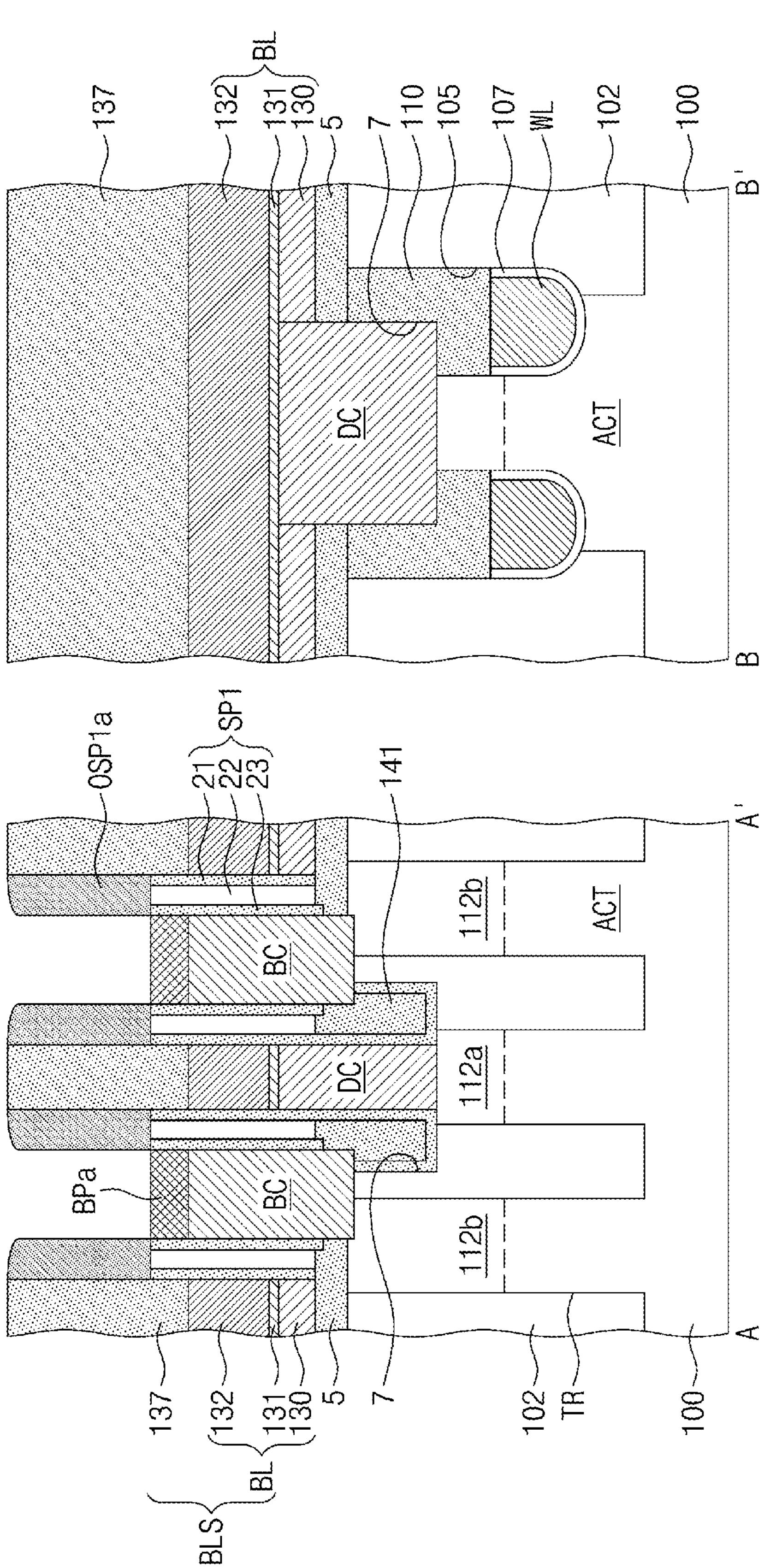

FIGS. 17 and 18 are cross-sectional views illustrating a method of manufacturing a semiconductor memory device according to some embodiments of the present disclosure. FIG. 17 is a cross-sectional view taken along lines A-A' and B-B' of FIG. 12A. FIG. 18 is a cross-sectional view taken along lines A-A' and B-B' of FIG. 13A.

Referring to FIG. 17, after the process shown in FIG. 11B, a polysilicon layer may be deposited between adjacent first preliminary spacers 21*a* to form a preliminary storage node contact. The first preliminary spacer 21*a*, the second preliminary spacer 22*a*, and the third preliminary spacer 23*a* may be etched to a vertical level similar to an upper surface of the preliminary storage node contact and thus the first sub-spacer 21, the second sub-spacer 22, and the third sub-spacer 23 may be formed. Thereafter, the preliminary storage node contact may be etched to form a storage node contact BC. A conductive material may be deposited on the entire surface of the substrate 100 and then a preliminary barrier layer BP1 may be formed through a planarization process.

Referring to FIG. 18, the preliminary barrier layer BP1 may be etched to form the barrier layer BPa. The preliminary barrier layer BP1 may be etched to partially expose a side surface of the bit line capping pattern 137. An oxide layer may be conformally formed on the entire surface of the substrate 100. The oxide layer may be formed to cover the upper surface of the first spacer SP1, the upper surface of the barrier layer BPa, the bit line capping pattern 137, and the insulation fence 40. An oxide spacer layer OSP1*a* may be formed by performing an etch-back process on the oxide layer. An upper surface of the barrier layer BPa and an upper surface of the bit line capping pattern 137 may be exposed by the etch-back process. The oxide layer may include, for example, silicon oxide. Thereafter, the semiconductor memory device of FIG. 3 may be manufactured by performing the same process as the process described with reference to FIGS. 14A, 14B, 15, 16, and 2.

According to some embodiments, the landing pad of the semiconductor memory device may include the pad portion and the protruding portion extending onto the upper surface of the spacer structure. The structure of the landing pad may increase the contact area between the storage node contact and the landing pad. Accordingly, the contact margin of the pad portion of the landing pad may be improved, thereby providing the semiconductor memory device having improved reliability.

As used herein, the terms "comprises", "comprising", "includes", "including", "has", "having" and any other variations thereof specify the presence of the stated features, steps, operations, elements, components, and/or groups but do not preclude the presence or addition of one or more other features, steps, operations, elements, components, and/or groups thereof.

While example embodiments are described above, a person skilled in the art may understand that many modifications and variations are made without departing from the scope of the present disclosure defined in the following claims. Accordingly, the example embodiments of the present disclosure should be considered in all respects as illustrative and not restrictive.

What is claimed is:

1. A semiconductor memory device comprising:
a substrate that includes an active pattern;
a bit line structure that crosses the active pattern;
a storage node contact electrically connected to the active pattern next to the bit line structure;
a spacer structure between a side surface of the bit line structure and the storage node contact, wherein an upper surface of the spacer structure is at a vertical level lower than an upper surface of the bit line structure with a lower surface of the substrate providing a base reference plane;
an insulating pattern on the spacer structure; and
a landing pad structure electrically connected to the storage node contact and on the spacer structure and the bit line structure,
wherein the landing pad structure comprises:
a first side surface in contact with the spacer structure;
a second side surface in contact with the bit line structure; and
a third side surface in contact with the insulating pattern.

2. The semiconductor device of claim 1, wherein the landing pad structure has a stepped shape in a cross-sectional view.

3. The semiconductor device of claim 1, wherein the spacer structure includes a first spacer and a second spacer on an upper surface of the first spacer,
wherein the first spacer is a multilayer spacer, and
wherein the second spacer is a single-layer spacer.

4. The semiconductor device of claim 3, wherein the second spacer has a closed shape in a plan view, and
wherein the second spacer has a first height between the first spacer and the insulating pattern and a second height different from the first height between the first spacer and the landing pad structure.

5. The semiconductor device of claim 1, wherein the spacer structure comprises:
a first sub-spacer in contact with the bit line structure;
a second sub-spacer on a side surface of the first sub-spacer; and
a third sub-spacer in contact with the storage node contact,
wherein the second sub-spacer is between the first sub-spacer and the third sub-spacer.

6. The semiconductor device of claim 1, wherein the landing pad structure comprises:
a barrier pattern adjacent to the storage node contact; and
a landing pad adjacent to the insulating pattern,
wherein the landing pad includes a protruding portion between the barrier pattern and the bit line structure, and
wherein the protruding portion is vertically aligned with the spacer structure.

7. The semiconductor device of claim 6, wherein the barrier pattern includes a conductive material different from that of the landing pad.

8. The semiconductor device of claim 1, wherein a lower portion of the insulating pattern adjacent to the spacer structure is vertically aligned with the spacer structure.

9. A semiconductor device comprising:
a substrate that includes an active pattern, the active pattern including a first source/drain region and a second source/drain region spaced apart from each other;
a bit line structure that is electrically connected to the first source/drain region and crosses the active pattern;
a storage node contact electrically connected to the second source/drain region;
a spacer structure on a side of the bit line structure, wherein an upper surface of the spacer structure is at a lower vertical level than an upper surface of the bit line structure with a lower surface of the substrate providing a base reference plane;
a landing pad structure electrically connected to the storage node contact; and
an insulating pattern on the spacer structure and adjacent to the landing pad structure,
wherein the spacer structure comprises:
a first spacer between the bit line structure and the storage node contact; and
a second spacer on an upper surface of the first spacer, and between the bit line structure and the landing pad structure,
wherein the first spacer is a multilayer spacer, and
wherein the second spacer is a single-layer spacer.

10. The semiconductor device of claim 9, wherein the landing pad structure has a stepped shape in a cross-sectional view.

11. The semiconductor device of claim 9, wherein the landing pad structure comprises:
a first side surface in contact with the spacer structure;
a second side surface in contact with the bit line structure; and
a third side surface in contact with the insulating pattern.

12. The semiconductor device of claim 9, wherein the first spacer comprises:
a first sub-spacer adjacent to the bit line structure;
a second sub-spacer on a side surface of the first sub-spacer; and
a third sub-spacer adjacent to the storage node contact,
wherein the second sub-spacer is between the first sub-spacer and the third sub-spacer.

13. The semiconductor device of claim 9, wherein the landing pad structure comprises:
a barrier pattern adjacent to the storage node contact; and
a landing pad adjacent to the insulating pattern, and
wherein the landing pad has a 'T'-shaped cross section.

14. The semiconductor device of claim 13, wherein the barrier pattern includes a conductive material different from that of the landing pad.

15. The semiconductor device of claim 13, wherein a width of a lower surface of the landing pad is equal to a width of an upper surface of the spacer structure.

16. The semiconductor device of claim 9, wherein a width of a lower surface of the insulating pattern is equal to a width of an upper surface of the spacer structure.

17. The semiconductor device of claim 9, wherein the first spacer includes an oxide and a nitride, and wherein the second spacer includes an oxide.

18. A semiconductor memory device comprising:

a substrate that includes an active pattern, the active pattern including a first source/drain region and a pair of second source/drain regions spaced apart from each other with the first source/drain region therebetween;

a device isolation layer on the substrate and in a trench that defines the active pattern;

a word line extending in a first direction that crosses the active pattern, wherein the word line is between the first and second source/drain regions;

a gate dielectric layer between the word line and the active pattern;

a word line capping pattern on the word line;

an interlayer insulating pattern on the word line capping pattern;

a bit line structure electrically connected to the first source/drain region and extending in a second direction that intersects the first direction, wherein the bit line structure crosses the active pattern and is on the interlayer insulating pattern;

a spacer structure on a side surface of the bit line structure, wherein an upper surface of the spacer structure is at a lower vertical level than an upper surface of the bit line structure with a lower surface of the substrate providing a base reference plane;

a storage node contact electrically connected to at least one of the second source/drain regions, wherein the storage node contact is spaced apart from the bit line structure with the spacer structure therebetween;

a landing pad structure electrically connected to the storage node contact;

an insulating pattern on the spacer structure; and a data storage pattern on the landing pad structure, wherein the landing pad structure has a stepped shape in a cross-sectional view, and wherein the spacer structure includes a multilayer spacer on the interlayer insulating pattern and a single-layer spacer on the multilayer spacer.

19. The semiconductor device of claim 18, wherein the landing pad structure comprises:

a first side surface in contact with the spacer structure;

a second side surface in contact with the bit line structure; and a third side surface in contact with the insulating pattern.

20. The semiconductor device of claim 18, wherein the landing pad structure comprises:

a barrier pattern adjacent to the storage node contact; and a landing pad adjacent to the insulating pattern, and wherein the landing pad has a ‘T’-shaped cross section.

* * * * *